(12) United States Patent  
Kim et al.

(10) Patent No.: US 7,477,350 B2  
(45) Date of Patent: Jan. 13, 2009

(54) THIN FILM ARRAY PANEL

(75) Inventors: Dong-Gyu Kim, Yongin-si (KR); Seong-Young Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/848,021

(22) Filed: Aug. 30, 2007

(65) Prior Publication Data  
US 2007/0291192 A1 Dec. 20, 2007

Related U.S. Application Data

(63) Continuation of application No. 10/843,619, filed on May 12, 2004, now Pat. No. 7,277,148.

(30) Foreign Application Priority Data  
May 12, 2003 (KR) .......................... 2003-0029841

(51) Int. Cl.  
*G02F 1/1333* (2006.01)  
*G02F 1/136* (2006.01)  
(52) U.S. Cl. ........................... 349/138; 349/42; 349/43

(58) Field of Classification Search ................ 349/138, 349/42, 156, 155, 43  
See application file for complete search history.

(56) References Cited

U.S. PATENT DOCUMENTS

| | | | |
|---|---|---|---|
| 5,003,356 A | | 3/1991 | Wakai et al. |
| 5,576,859 A | * | 11/1996 | Castleberry ................. 349/110 |
| 5,781,254 A | * | 7/1998 | Kim et al. ..................... 349/44 |
| 6,445,432 B2 | | 9/2002 | Yamamoto et al. |
| 6,614,496 B1 | * | 9/2003 | Song et al. ................... 349/114 |
| 2002/0109811 A1 | | 8/2002 | Park et al. |
| 2004/0001172 A1 | * | 1/2004 | Tanaka et al. ............... 349/113 |

* cited by examiner

*Primary Examiner*—David Nelms  
*Assistant Examiner*—W. Patty Chen  
(74) *Attorney, Agent, or Firm*—MacPherson Kwok Chen & Heid, LLP.; David S. Park

(57) ABSTRACT

A gate line is formed on a substrate, and a gate insulating layer is formed thereon. A data line is formed on the gate insulating layer, and a passivation layer is formed on the data line. The passivation layer has an opening exposing the gate insulating layer. A pixel electrode is formed on the passivation layer and it overlaps the data line and the passivation layer.

12 Claims, 33 Drawing Sheets

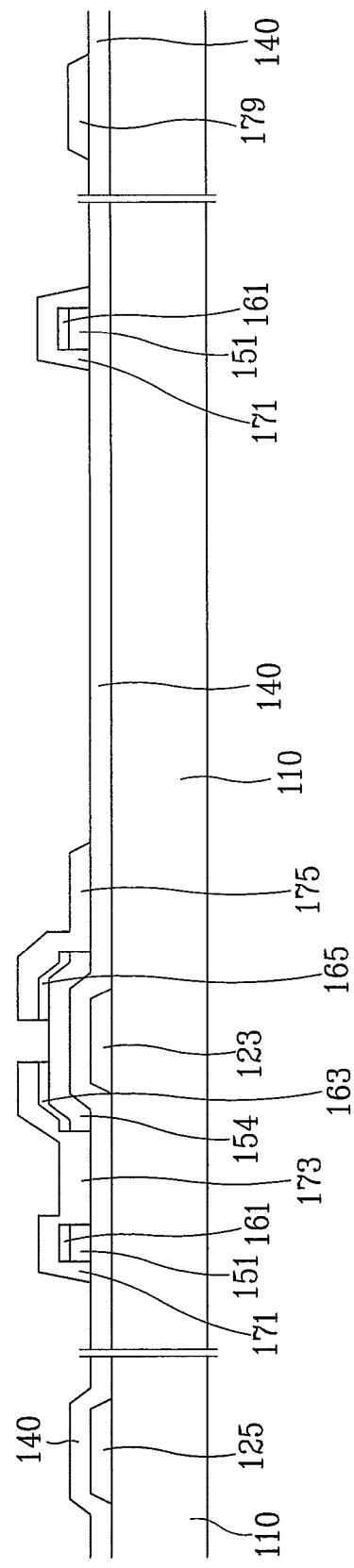

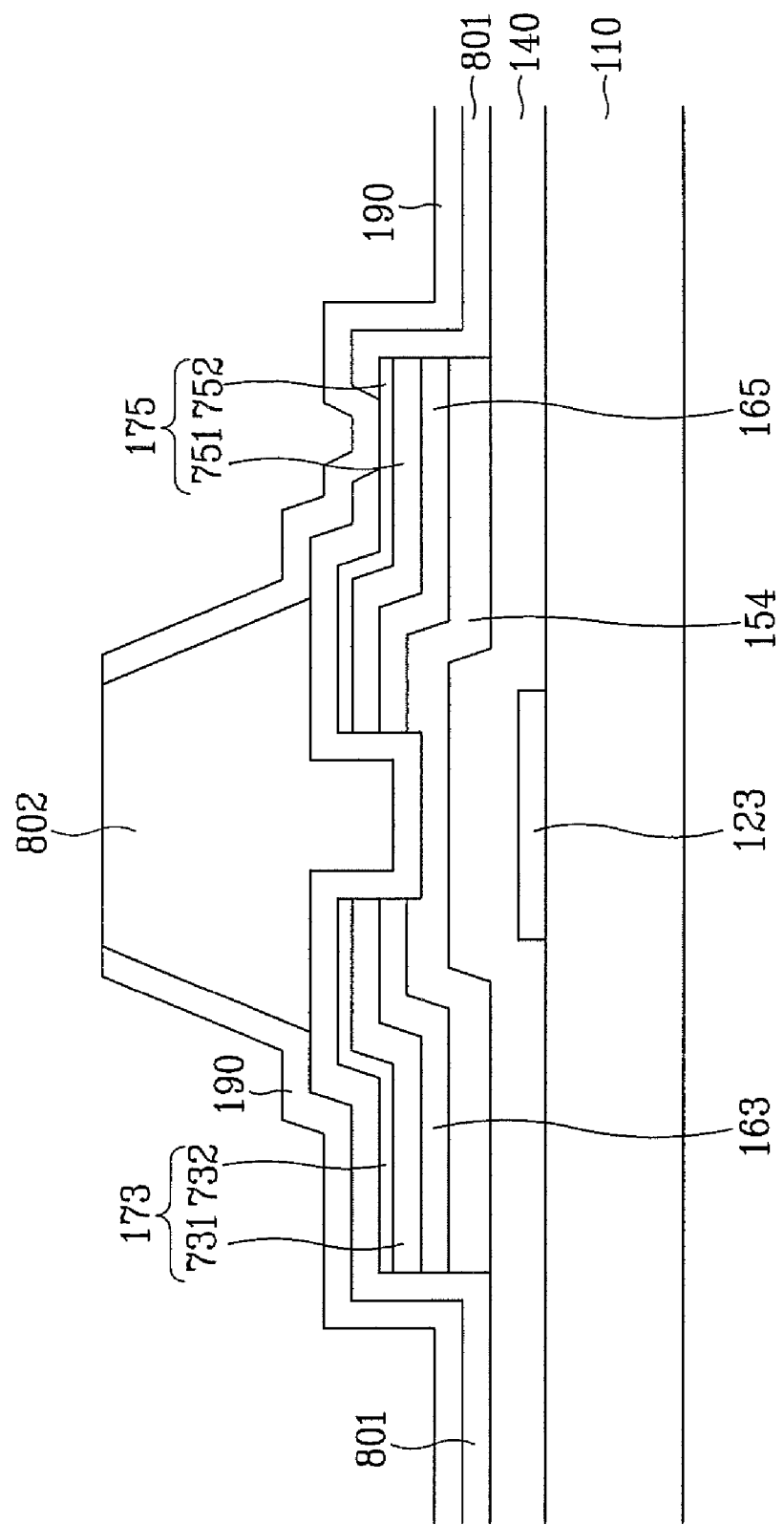

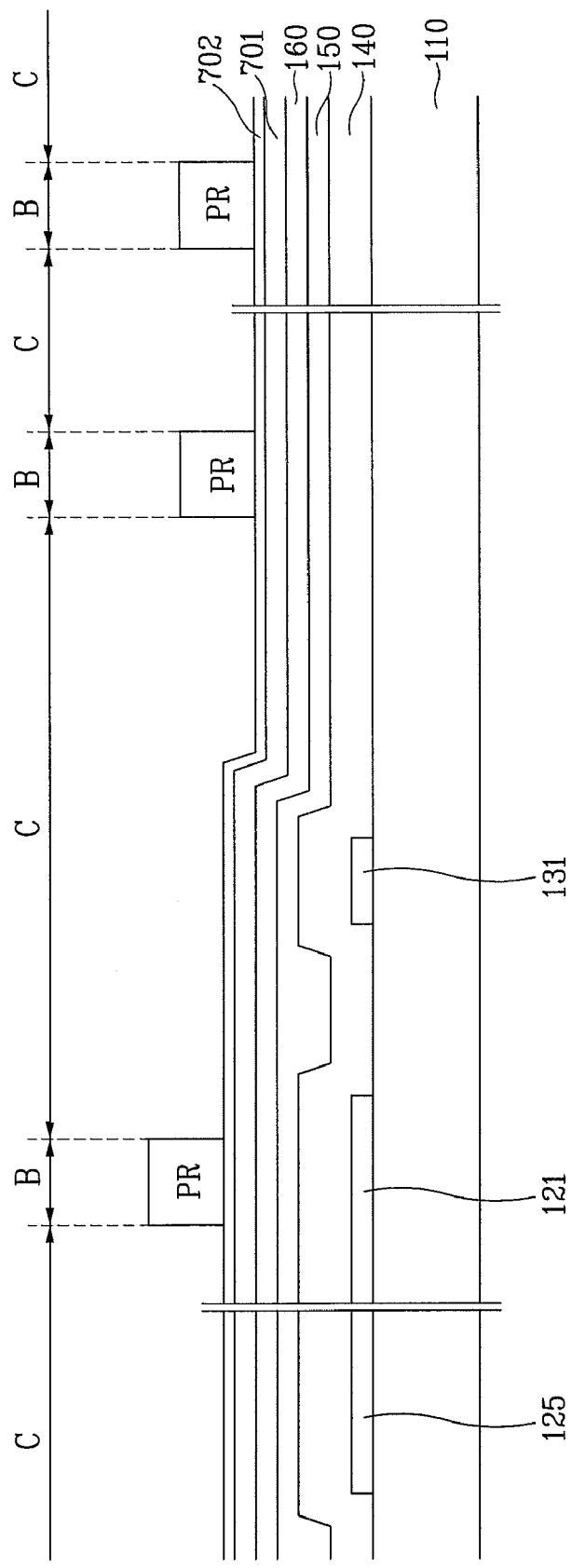

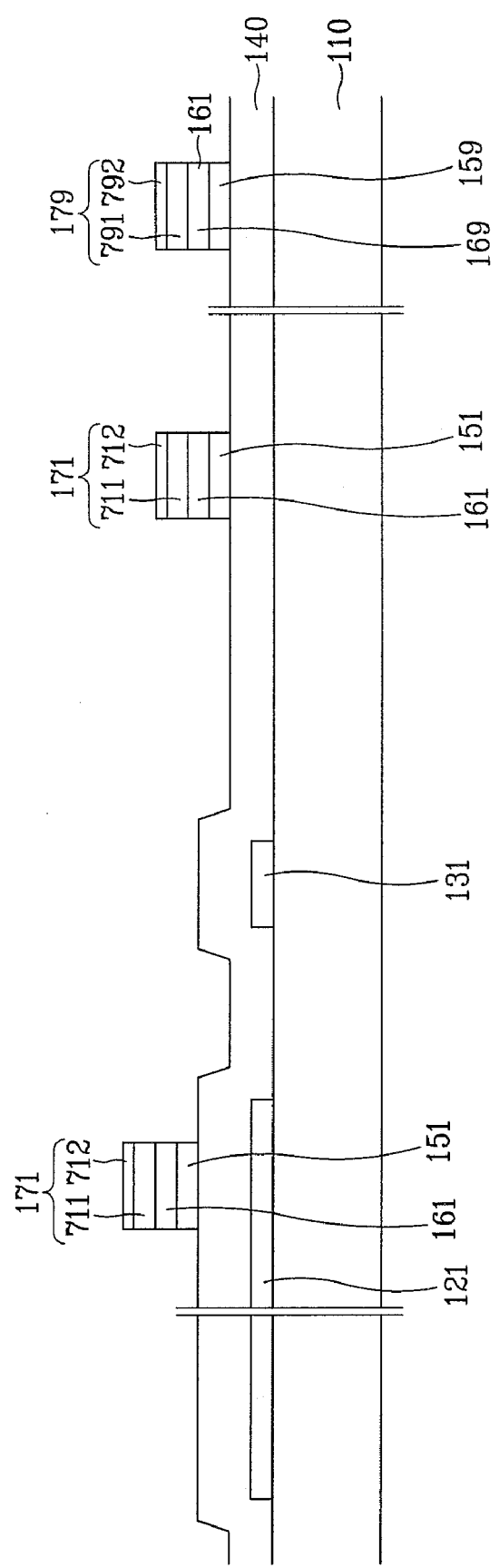

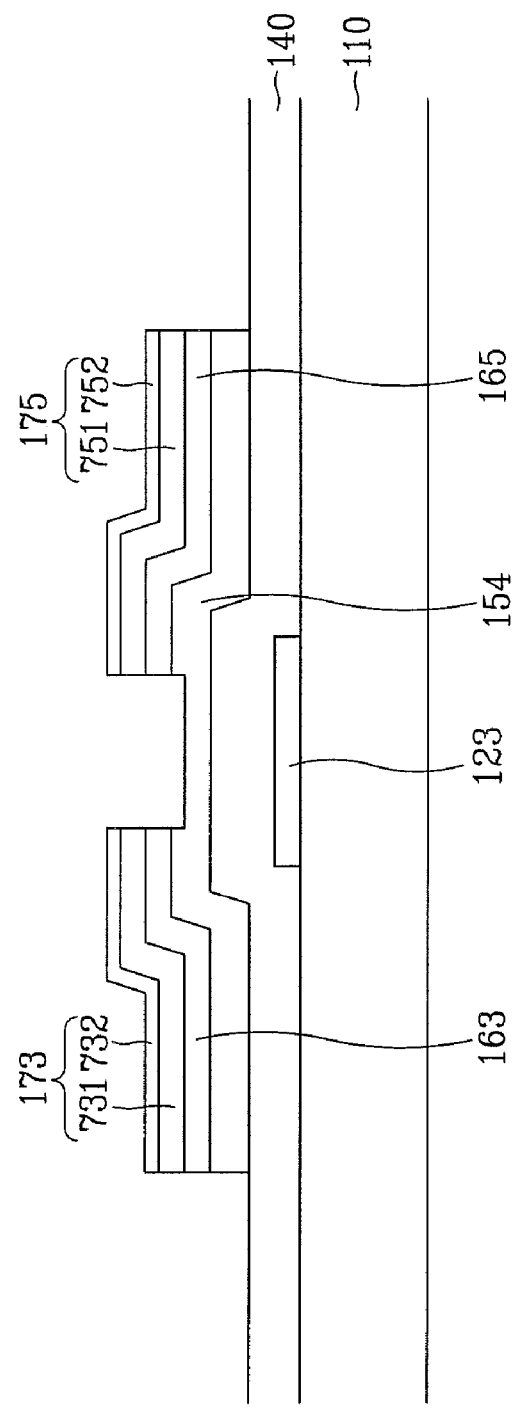

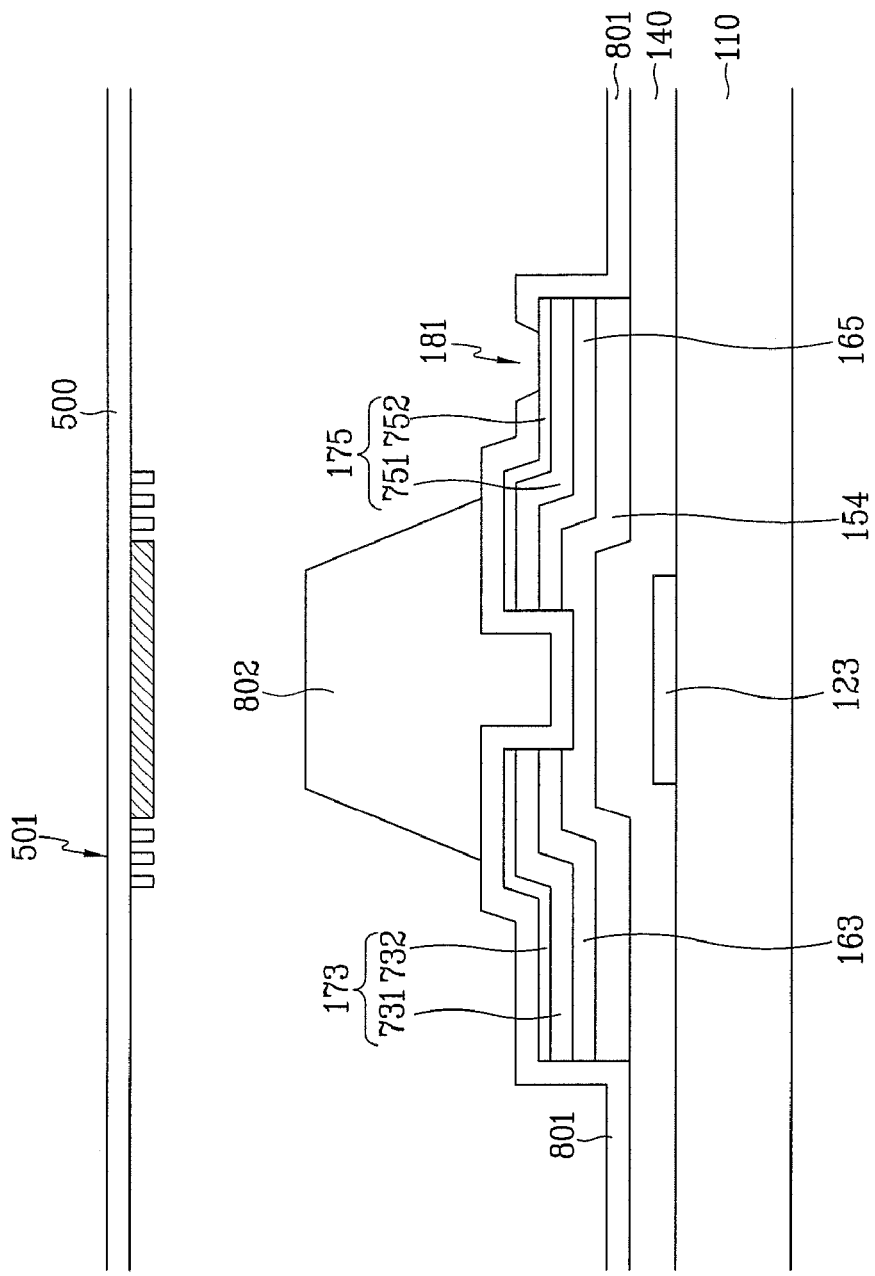

THIN FILM ARRAY PANEL

CROSS-REFERENCE TO RELATED APPLICATIONS

This application is a continuation of and claims the benefit of U.S. patent application Ser. No. 10/843,619 filed on May 12, 2004, now U.S. Pat. No. 7,277,148 which claims priority to and the benefit of Korean Patent Application No. 2003-0029841, filed on May 12, 2003, which is incorporated herein by reference.

BACKGROUND OF THE INVENTION (a) Field of the Invention

The present invention relates to a thin film array panel.

(b) Description of the Related Art

Generally, a thin film array panel is used for display devices such as liquid crystal displays. A liquid crystal display (LCD) is one of the most widely used flat panel displays. LCDs are used in notebook or laptop computers, desktop computer monitors and televisions. LCDs are lightweight and occupy less space than conventional cathode ray tube (CRT) displays.

The general structure of an LCD consists of a liquid crystal (LC) layer that is positioned between a pair of panels including field generating electrodes and polarizers. The LC layer is subject to an electric field generated by the electrodes and variations in the field strength change the molecular orientation of the LC layer. For example, upon application of an electric field, the molecules of the LC layer change their orientation to change the polarization of light passing through the LC layer. Appropriately positioned polarizing filters selectively block the polarized light, creating dark areas that can represent desired images.

The LCD further includes a plurality of color filters for representing color images provided on either of the panels and an organic insulating layer covering the color filters. The organic insulating layer is usually thick enough to smooth the surface of the panels such that the field generating electrodes thereon have a uniform flat surface.

However, the thick organic layer reduces the light transmittance especially for the blue light, thereby causing so called yellowish phenomenon. In addition, the thick organic layer and the color filters, which are also very thick, make it difficult to obtain smooth profiles of contact holes that are provided for the contact between the conductive layers on and under the color filters and the organic layer.

SUMMARY OF THE INVENTION

A thin film array panel is provided, which includes: a gate line formed on a substrate; a first insulating layer on the gate line; a data line formed on the first insulating layer; a second insulating layer formed on the data line and having an opening exposing the first insulating layer; and a pixel electrode formed on the first insulating layer and overlapping the data line and the second insulating layer.

The second insulating layer may have an inclined lateral surface preferably having an inclination angle of about 13-40 degrees and may have a tope surface. The pixel electrode may overlap the lateral surface of the second insulating layer but not the top surface of the second insulating layer.

The second insulating layer may have a dielectric constant smaller than about 4.0 and may be made of such as an acrylic organic material.

The thin film array panel may further include a third insulating layer disposed under the second insulating layer. The third insulating layer may include comprises inorganic material such as silicon nitride. The third insulating layer may be disposed between the pixel electrode and the first insulating layer, and the pixel electrode may be in direct contact with the third insulating layer at least in part.

The pixel electrode is in direct contact with the first insulating layer at least in part.

The second insulating layer may cover the gate line.

The thin film array panel may further include a thin film transistor connected to the gate line, the data line, and the pixel electrode.

The thin film array panel may further include a light blocking film disposed between the data line and the pixel electrode. The light blocking film may be formed under the first insulating layer.

BRIEF DESCRIPTION OF THE DRAWINGS

The present invention will become more apparent by describing embodiments thereof in detail with reference to the accompanying drawings in which:

FIGS. 2B, 3B, 4B, and 5B are sectional views of the TFT array panel shown in FIGS. 2A, 3A, 4A, and 5A taken along the lines IIB-IIB', IIIB-IIIB', IVB-IVB' and VB-VB', respectively;

FIGS. 7B and 7C are sectional views of the TFT array panel shown in FIG. 7A taken along the line VIIB-VIIB' and the line VIIC-VIIC', respectively;

FIGS. 10A and 10B are sectional views of the TFT array panel shown in FIG. 8A taken along the lines VIIIB-VIIIB' and VIIIC-VIIIC', respectively, and illustrate the step following the step shown in FIGS. 9A and 9B;

FIGS. 11B and 11C are sectional views of the TFT array panel shown in FIG. 11A taken along the lines XIB-XIB' and XIC-XIC', respectively;

FIGS. 12B and 12C are sectional views of the TFT array panel shown in FIG. 12A taken along the lines XIIB-XIIB' and XIIC-XIIC', respectively;

DETAILED DESCRIPTION OF EMBODIMENTS

Figure 1A:
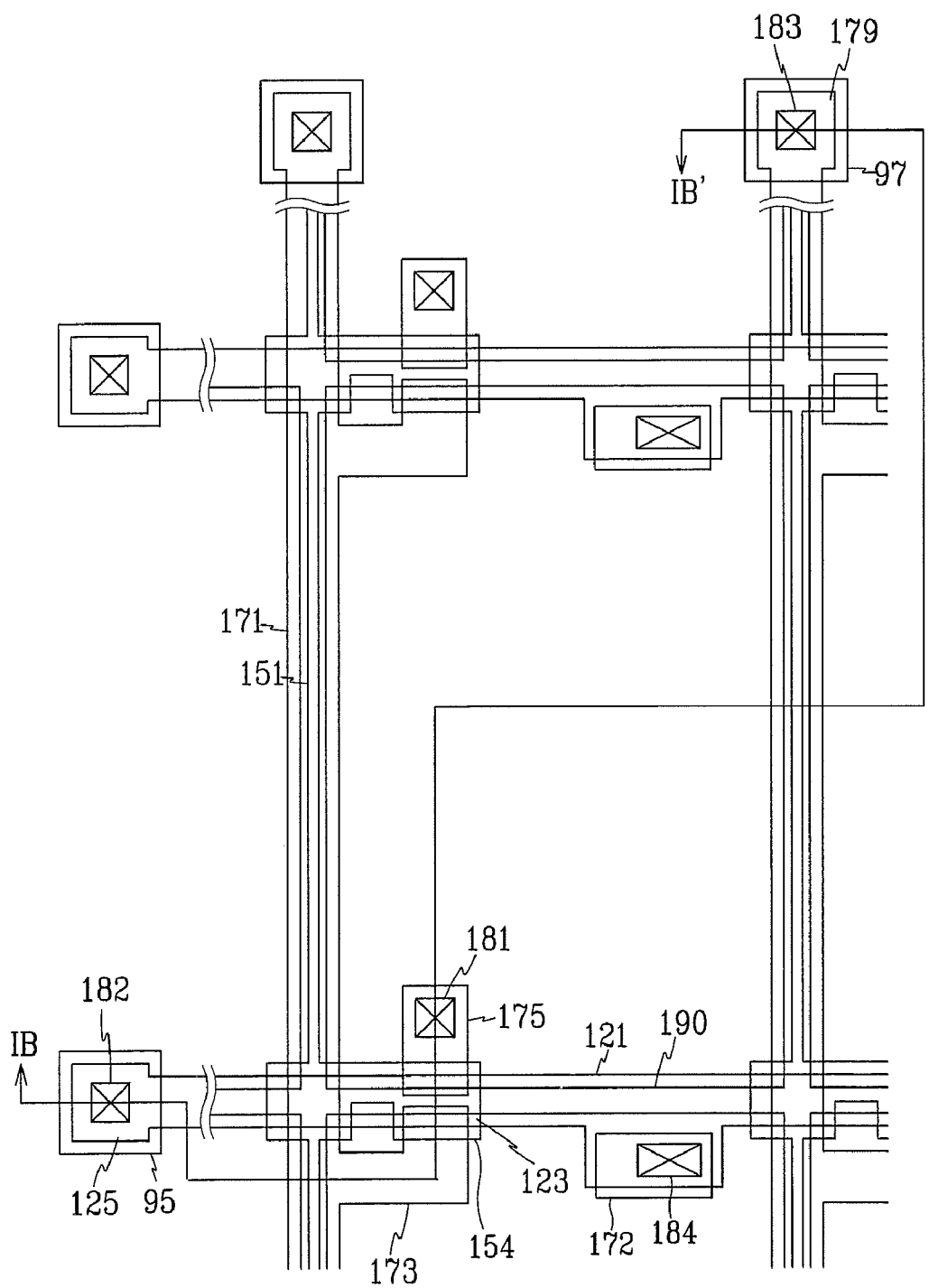
FIG. 1A is an exemplary layout view of a TFT array panel shown according to an embodiment of the present invention.

The present invention now will be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films and regions are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

Now, TFT array panels and manufacturing methods thereof according to embodiments of the present invention will be described with reference to the accompanying drawings.

A TFT array panel for an LCD will be described in detail with reference to FIGS. 1A and 1B.

Figure 1B:
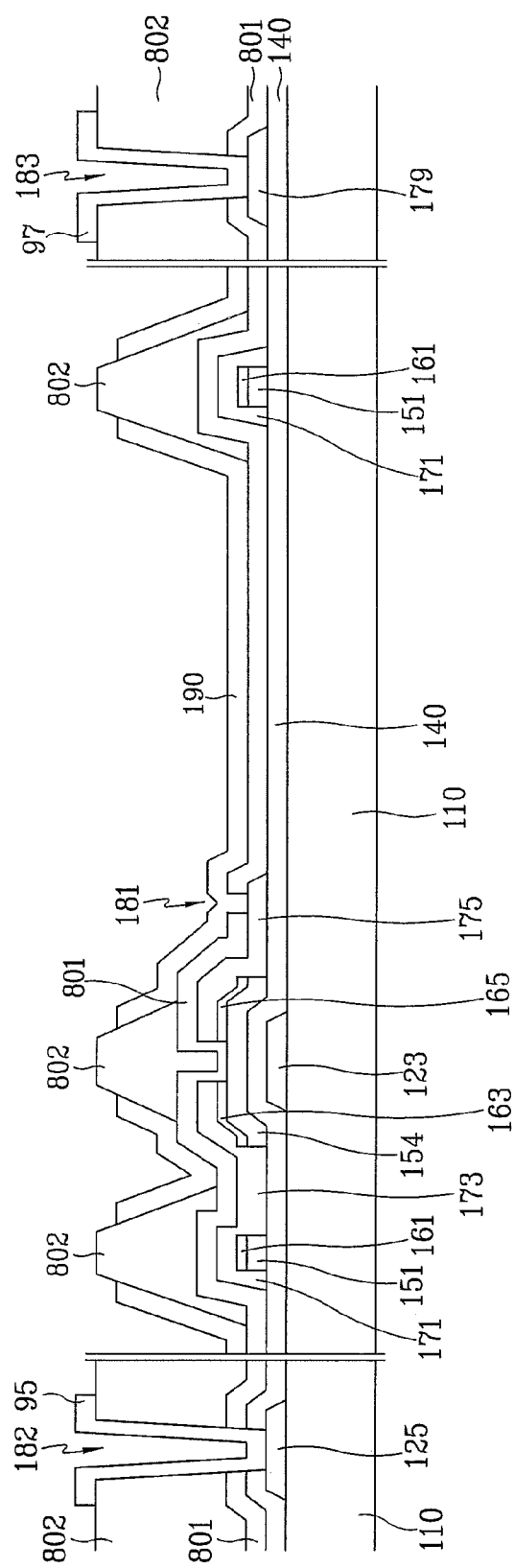
FIG. 1B is a sectional view of the TFT array panel shown in FIG. 1A taken along the line IB-IB'.

FIG. 1A is an exemplary layout view of a TFT array panel shown according to an embodiment of the present invention, and FIG. 1B is a sectional view of the TFT array panel shown in FIG. 1A taken along the line IB-IB'.

A plurality of gate lines 121 for transmitting gate signals extending substantially in a longitudinal direction are formed on an insulating substrate 110. Each gate line 121 extends substantially in a transverse direction and a plurality of portions of each gate line 121 form a plurality of gate electrodes 123. Each gate line 121 includes a plurality of projections protruding downward and an expansion 125 having a large area for contact with another layer or an external device.

The gate lines 121 are preferably made of Al and Al alloy, Ag containing metal such as Ag and Ag alloy, Cu containing metal such as Cu and Cu alloy, Cr, Mo, Mo alloy, Ta, or Ti. They may have a multi-layered structure. The gate lines 121 may include two films having different physical characteristics, a lower film and an upper film. The upper film is preferably made of low resistivity metal including Al containing metal such as Al and Al alloy for reducing signal delay or voltage drop in the gate lines 121. On the other hand, the lower film is preferably made of material such as Cr, Mo, Mo alloy, Ta and Ti, which has good physical, chemical, and electrical contact characteristics with other materials such as indium tin oxide (ITO) and indium zinc oxide (IZO). A good exemplary combination of the lower film material and the upper film material is Cr and Al—Nd alloy.

In addition, the lateral sides of the gate lines 121 are inclined relative to a surface of the substrate 110, and the inclination angle thereof ranges about 30-80 degrees.

A gate insulating layer 140 preferably made of silicon nitride (SiNx) is formed on the gate lines 121.

A plurality of semiconductor stripes 151 preferably made of hydrogenated amorphous silicon (abbreviated to "a-Si") are formed on the gate insulating layer 140. Each semiconductor stripe 151 extends substantially in the longitudinal direction and has a plurality of projections 154 branched out toward the gate electrodes 123. The width of each semiconductor stripe 151 becomes large near the gate lines 121 such that the semiconductor stripe 151 covers large areas of the gate lines 121.

A plurality of ohmic contact stripes and islands 161 and 165 preferably made of silicide or n+ hydrogenated a-Si heavily doped with n type impurity are formed on the semiconductor stripes 151. Each ohmic contact stripe 161 has a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are inclined relative to a surface of the substrate 110, and the inclination angles thereof are preferably in a range between about 30-80 degrees.

A plurality of data lines 171, a plurality of drain electrodes 175, and a plurality of storage capacitor conductors 172 are formed on the ohmic contacts 161 and 165 and the gate insulating layer 140.

The data lines 171 for transmitting data voltages extend substantially in the longitudinal direction and intersect the gate lines 121. Each data line 171 includes an expansion 179 having a larger area for contact with another layer or an external device.

A plurality of branches of each data line 171, which project toward the drain electrodes 175, form a plurality of source electrodes 173. Each pair of the source electrodes 173 and the drain electrodes 175 are separated from each other and opposite each other with respect to a gate electrode 123. A gate electrode 123, a source electrode 173, and a drain electrode 175 along with a projection 154 of a semiconductor stripe 151 form a TFT having a channel formed in the projection 154 disposed between the source electrode 173 and the drain electrode 175.

The storage capacitor conductors 172 overlap the projections of the gate lines 121.

The data lines 171, the drain electrodes 175, and the storage capacitor conductors 172 are preferably made of refractory metal such as Cr, Mo, Mo alloy, Ta or Ta. They may include a lower film preferably made of Mo, Mo alloy or Cr and an upper film located thereon and preferably made of Al containing metal or Ag containing metal.

Like the gate lines 121, the data lines 171, the drain electrodes 175, and the storage capacitor conductors 172 have tapered lateral sides relative to a surface of the substrate 110, and the inclination angles thereof range about 30-80 degrees.

The ohmic contacts 161 and 165 are interposed only between the underlying semiconductor stripes 151 and the overlying data lines 171 and the overlying drain electrodes 175 thereon and reduce the contact resistance therebetween. The semiconductor stripes 151 include a plurality of exposed portions, which are not covered with the data lines 171 and the drain electrodes 175, such as portions located between the source electrodes 173 and the drain electrodes 175. Although the semiconductor stripes 151 are narrower than the data lines 171 at most places, the width of the semiconductor stripes 151 becomes large near the gate lines 121 as described above, to smooth the profile of the surface, thereby preventing the disconnection of the data lines 171.

A first passivation layer 801 preferably made of inorganic insulator such as silicon nitride is formed on the data lines 171, the drain electrodes 175, the storage conductors 172, and the exposed portions of the semiconductor stripes 151.

The first passivation layer 801 has a plurality of contact holes 181, 184 and 183 exposing the drain electrodes 175, the storage conductors 172, and the expansions 179 of the data lines 171, respectively. The first passivation layer 801 and the gate insulating layer 140 have a plurality of contact holes 182 exposing the expansions 125 of the gate lines 121.

A second passivation layer 802 preferably made of photosensitive organic material such as acrylic photosensitive resin and having a thickness larger than about 1.5 microns is formed on the first passivation layer 801. The second passivation layer 802 is disposed opposite the gate lines 121, the data lines 171, and the TFTs, and it is placed peripheral areas provided with the end portions 125 and 179 of the gate lines 121 and the data lines 171. However, the second passivation layer 802 is not disposed on most areas enclosed by the gate lines 121 and the data lines 171 such that it does not decrease the transmittance of light in the areas. The second passivation layer 802 may not be disposed opposite the gate lines 121. The second passivation layer 802 may be made of inorganic insulator such as SiNx and $SiO_2$.

The second passivation layer 801 has a plurality of contact holes extending from the contact holes 182 and 183 to expose the end portions 125 and 179 of the gate lines 121 and the data lines 171.

A plurality of pixel electrodes 190 and a plurality of contact assistants 95 and 97, which are preferably made of ITO or IZO, are formed on the first and the second passivation layers 801 and 802.

Each pixel electrode 190 overlaps the second passivation layer 802 only near the boundaries of the pixel electrodes 190 and most portions of the pixel electrodes 190 are disposed directly on the first passivation layer 801 such that the second passivation layer 802 does not decrease the light transmittance passing through the pixel electrodes 190. The portions of the second passivation layer 802 overlapping the pixel electrodes 190 preferably have smooth profiles such that the inclination angle of the overlapping portions is smaller than about 40 degrees, in particular, equal to about 25-30 degrees. This prevents the light leakage generated due to the height difference of the pixel electrode 190 caused by the second passivation layer 802. In addition, the thickness of the second passivation layer 802 larger than about 1.5 microns reduces the parasitic capacitance between the pixel electrode 190 and the data lines 171 and the gate lines 121. The pixel electrodes 190 overlap the gate lines 121 and the data lines 171 to increase aperture ratio but it is optional. In particular, it is preferable that the pixel electrodes 190 do not overlap the gate lines 121 when the second passivation layer 802 is not disposed on the gate lines 121 in order to reduce the parasitic capacitance between the gate lines and the pixel electrodes 190.

A plurality of light blocking members (not shown) preferably made of the same layer as the gate lines 121 may be provided between the pixel electrodes 190 and the data lines 171 so that the above described light leakage can be blocked. The light blocking members may overlap the data lines 171, but it is preferable that the overlapping is minimized for smaller parasitic capacitance therebetween. Two light blocking members located opposite each other with respect to a data line 171 may be connected to each other so that the parasitic capacitances between the data line 171 and the light blocking members.

The pixel electrodes 190 are physically and electrically connected to the drain electrodes 175 through the contact holes 181 and to the storage capacitor conductors 172 through the contact holes 184 such that the pixel electrodes 190 receive the data voltages from the drain electrodes 175 and transmit the received data voltages to the storage capacitor conductors 172.

The pixel electrodes 190 supplied with the data voltages generate electric fields in cooperation with a common electrode (not shown) on another panel (not shown), which reorient liquid crystal molecules in a liquid crystal layer (not shown) disposed therebetween.

A pixel electrode 190 and a common electrode form a liquid crystal capacitor, which stores applied voltages after turn-off of the TFT. An additional capacitor called a "storage capacitor," which is connected in parallel to the liquid crystal capacitor, is provided for enhancing the voltage storing capacity. The storage capacitors are implemented by overlapping the pixel electrodes 190 with the gate lines 121 adjacent thereto (called "previous gate lines"). The capacitances of the storage capacitors, i.e., the storage capacitances are increased by providing the projections at the gate lines 121 for increasing overlapping areas and by providing the storage capacitor conductors 172, which are connected to the pixel electrodes 190 and overlap the projections, under the pixel electrodes 190 for decreasing the distance between the terminals.

The contact assistants 95 and 97 are connected to the exposed expansions 125 of the gate lines 121 and the exposed expansions 179 of the data lines 171 through the contact holes 182 and 183, respectively. The contact assistants 95 and 97 are not requisites but preferred to protect the exposed portions 125 and 179 and to complement the adhesiveness of the exposed portions 125 and 179 and external devices.

According to another embodiment of the present invention, the pixel electrodes 190 are made of transparent conductive polymer. For a reflective LCD, the pixel electrodes 190 are made of opaque reflective metal. In these cases, the contact assistants 95 and 97 may be made of material such as ITO or IZO different from the pixel electrodes 190.

A method of manufacturing the TFT array panel shown in FIGS. 1A and 1B according to an embodiment of the present invention will be now described in detail with reference to FIGS. 2A to 5B as well as FIGS. 1A and 1B.

FIGS. 2A, 3A, 4A, and 5A are layout views of the TFT array panel shown in FIGS. 1A and 1B in intermediate steps of a manufacturing method thereof according to an embodiment of the present invention, and FIGS. 2B, 3B, 4B, and 5B are sectional views of the TFT array panel shown in FIGS. 2A, 3A, 4A, and 5A taken along the lines IIB-IIB', IIIB-IIIB', IVB-IVB' and VB-VB', respectively.

Figure 2A:
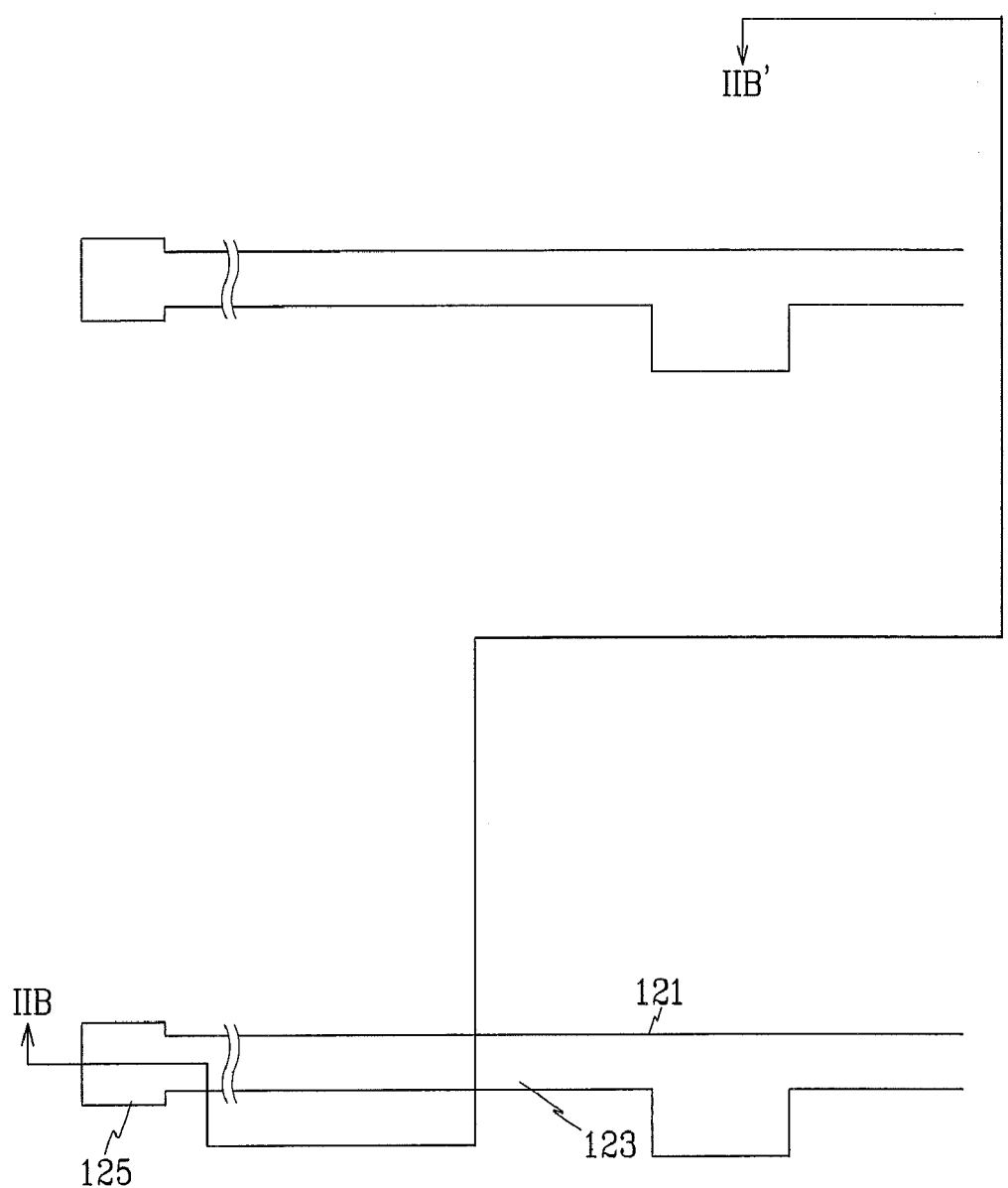
FIGS. 2A, 3A, 4A, and 5A are layout views of the TFT array panel shown in FIGS. 1A and 1B in intermediate steps of a manufacturing method thereof according to an embodiment of the present invention.
Figure 2B:
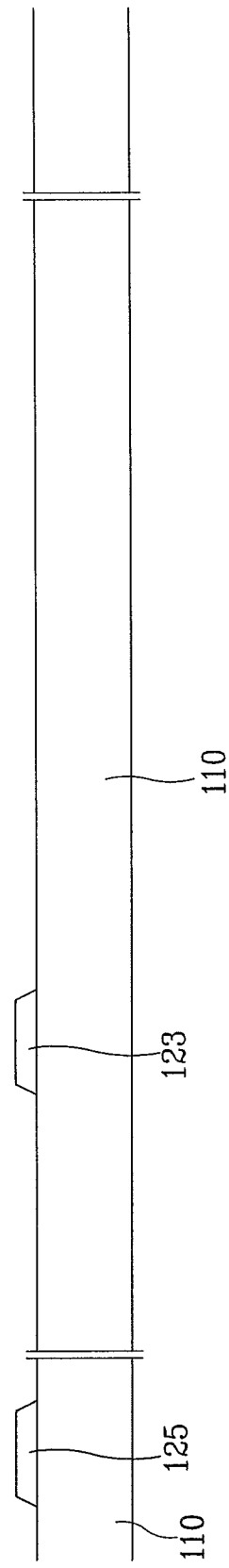

Referring to FIGS. 2A and 2B, a plurality of gate lines 121 including a plurality of gate electrodes 123 and a plurality of projections are formed on an insulating substrate 110 such as transparent glass by sputtering and wet or dry etching with photolithography.

Figure 3A:
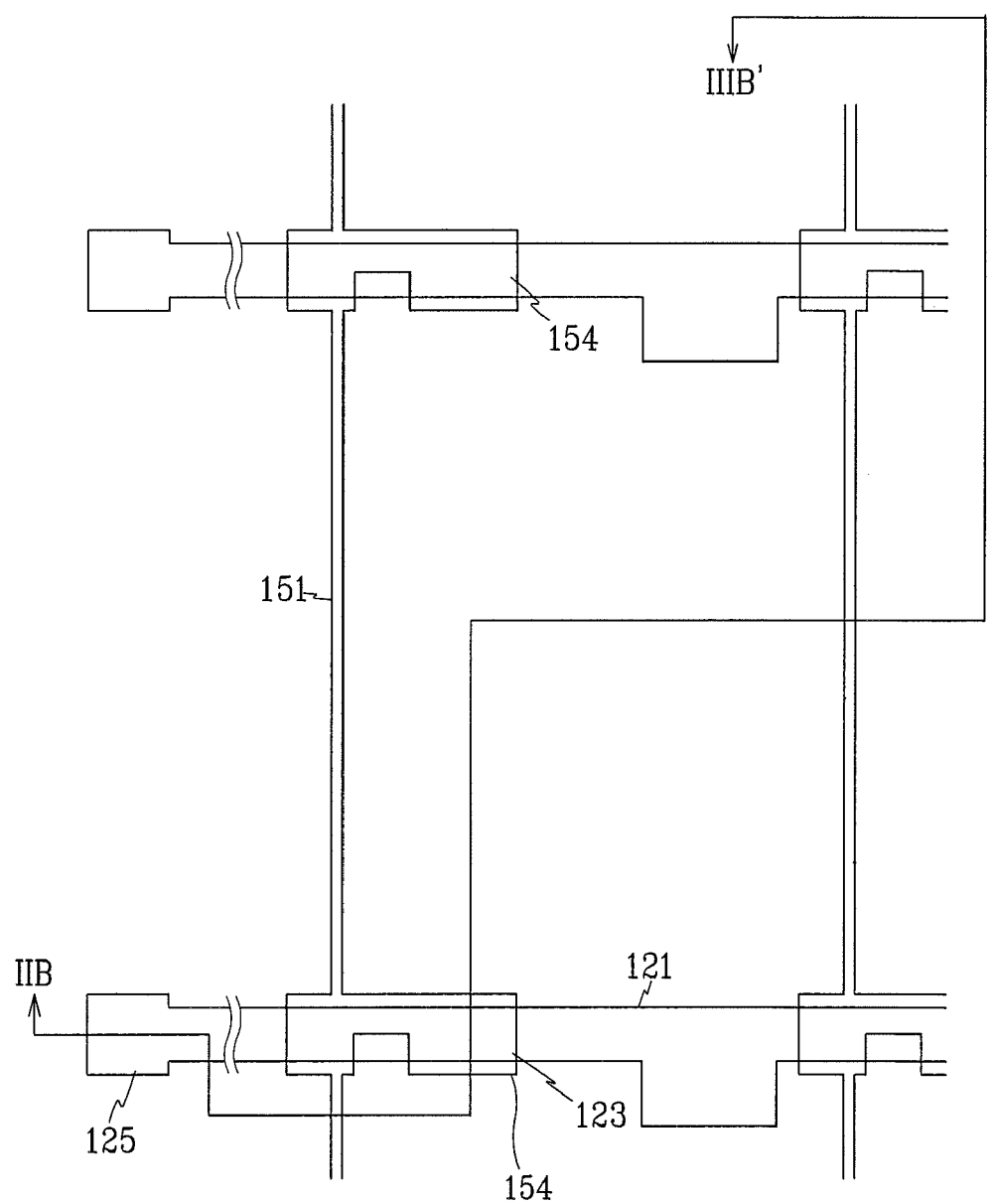
Figure 3B:
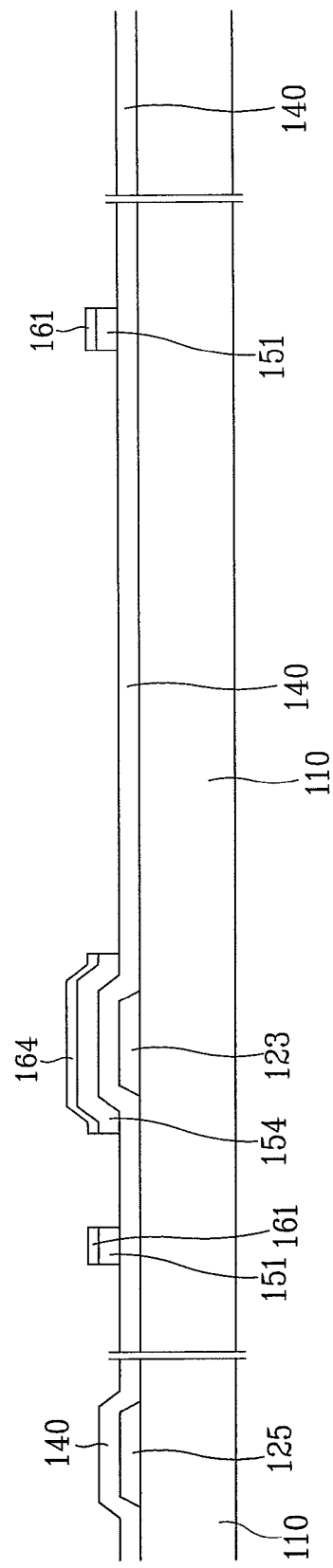

Referring to FIGS. 3A and 3B, after sequential deposition of a gate insulating layer 140, an intrinsic a-Si layer, and an extrinsic a-Si layer, the extrinsic a-Si layer and the intrinsic a-Si layer are photo-etched to form a plurality of extrinsic semiconductor stripes 164 and a plurality of intrinsic semiconductor stripes 151 including a plurality of projections 154 on the gate insulating layer 140. The gate insulating layer 140 is preferably made of silicon nitride or silicon oxide.

Figure 4A:
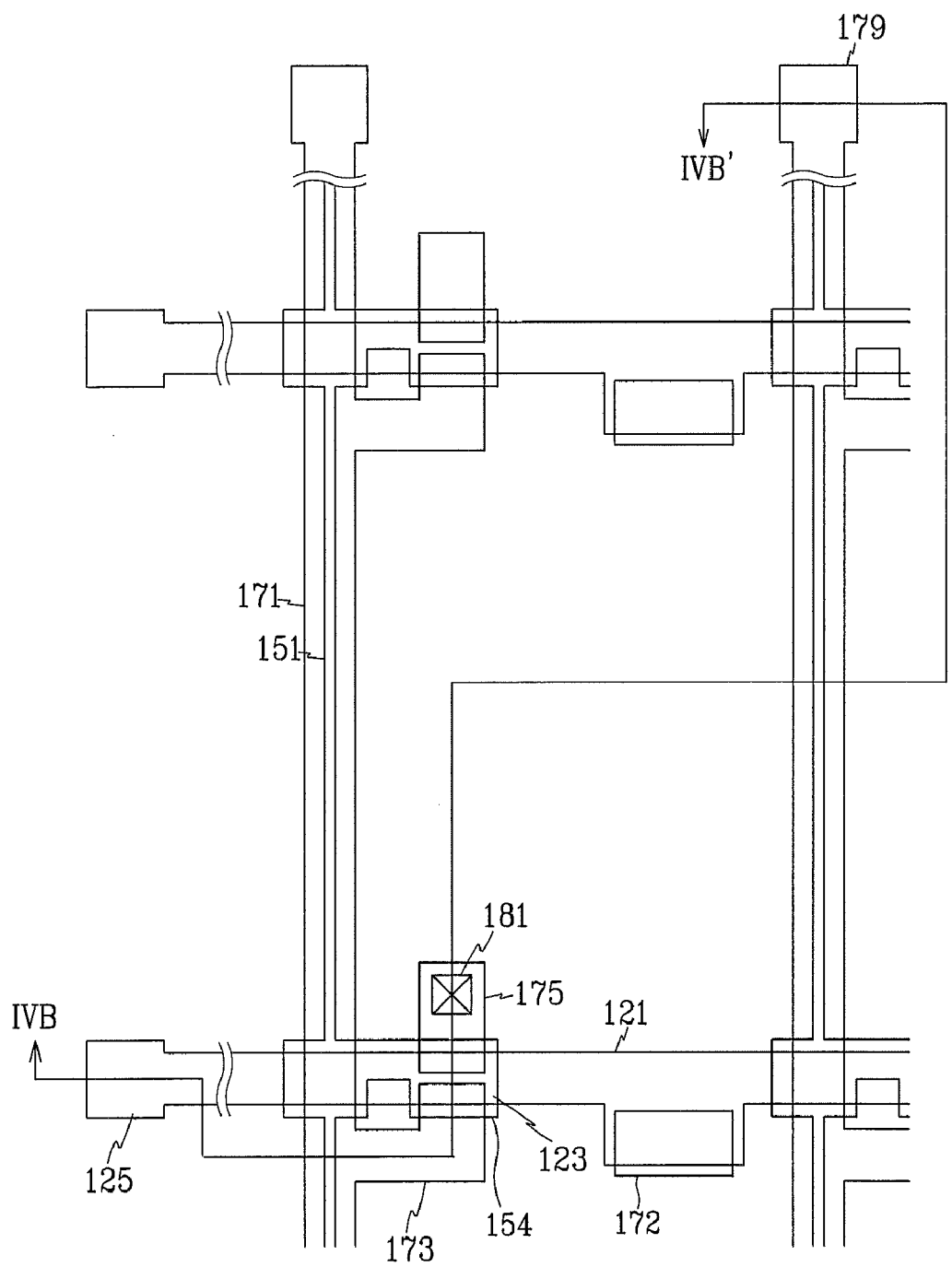

Referring to FIGS. 4A and 4B, a plurality of data lines 171 including a plurality of source electrodes 173, a plurality of drain electrodes 175, and a plurality of storage capacitor conductors 172 are formed by sputtering and photo etching.

Thereafter, portions of the extrinsic semiconductor stripes 164, which are not covered with the data lines 171, the drain electrodes 175, and the storage capacitor conductors 172, are removed to complete a plurality of ohmic contact stripes 161 including a plurality of projections 163 and a plurality of ohmic contact islands 165 and to expose portions of the intrinsic semiconductor stripes 151. The exposed portions of the intrinsic semiconductor stripes 151 may be subject to thickness reduction during the etching of the extrinsic semiconductor stripes 164. Oxygen plasma treatment preferably follows thereafter in order to stabilize the exposed surfaces of the semiconductor stripes 151.

Figure 5A:
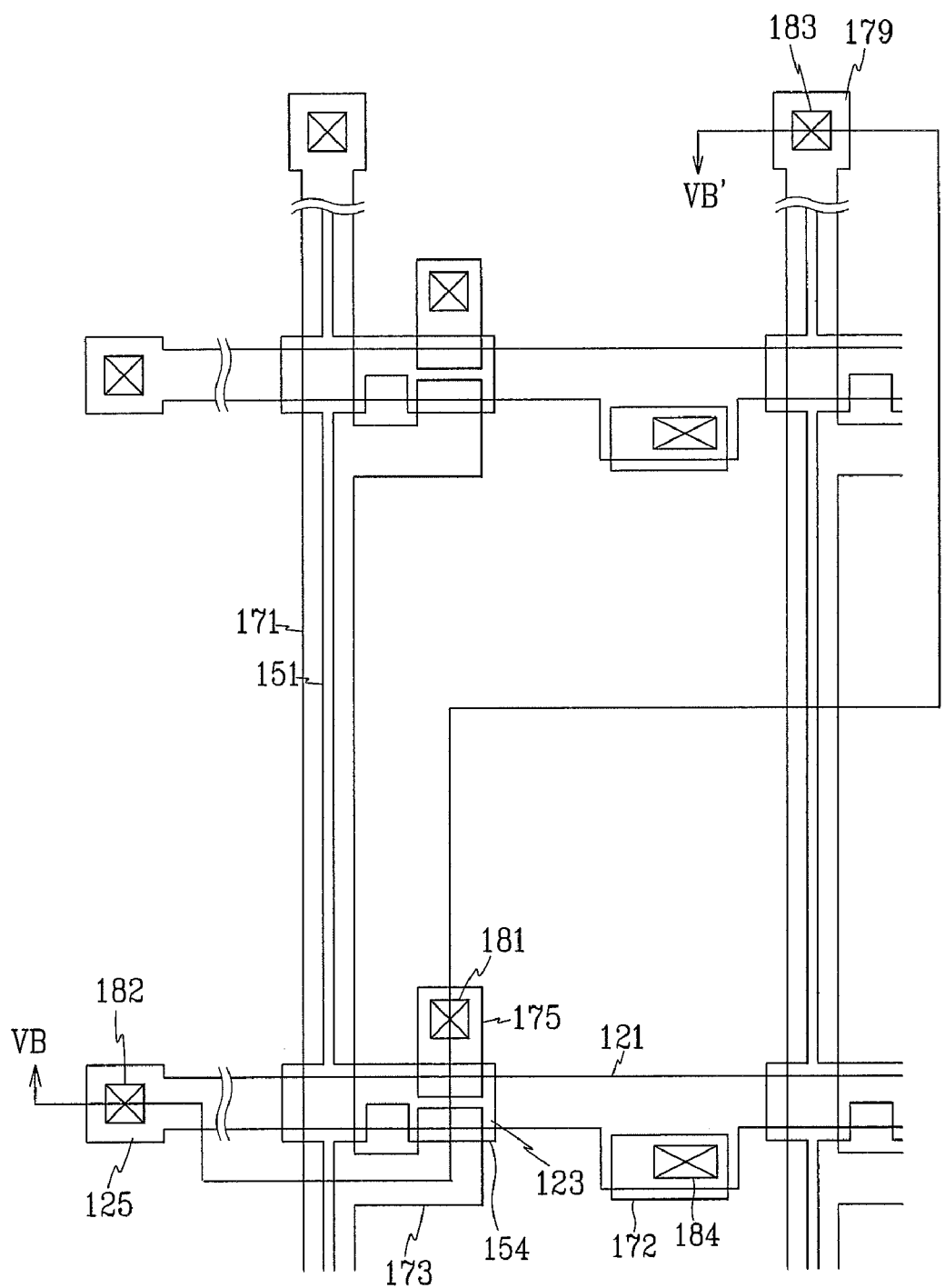
Figure 5B:
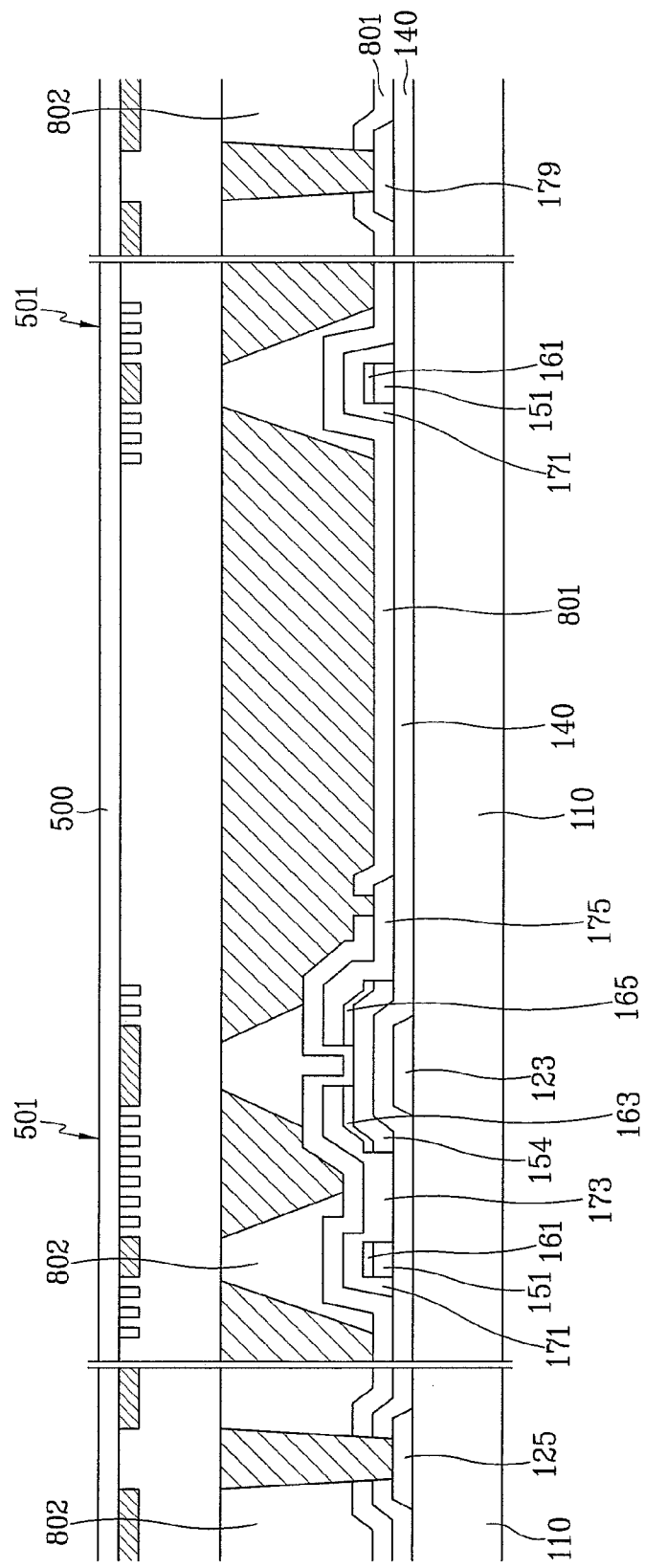

As shown in FIGS. 5A and 5B, a first passivation layer 801 is deposited and patterned along with the gate insulating layer 140 to form a plurality of contact holes 181-184.

Subsequently, a second passivation layer 802 preferably made of photosensitive organic insulator is coated. The second passivation layer 802 may be made of an acrylic organic insulator having a good flatness or a low dielectric CVDed (chemical-vapor-deposited) insulator such as SiOC or SiOF having a dielectric constant lower than about 4.0. A photomask 500 having a plurality of transmissive areas, a plurality of light blocking areas, and a plurality slit areas 501 is aligned with the substrate such that the slit areas 501 correspond to the light blocking areas corresponding to the data lines 171 and the gate lines 121 and the transmissive areas correspond to the contact holes 182 and 183 and areas enclosed by the data lines 171 and the gate lines 121. The second passivation layer 802 is then exposed to light and developed, and then portions of the second passivation layer 802 corresponding to the slit areas 501 form inclined surfaces.

Finally, as shown in FIGS. 1A and 1B, a plurality of pixel electrodes 190 and a plurality of contact assistants 95 and 97 are formed on the first passivation layer 801 by sputtering and photo-etching an ITO or IZO layer. Since the lateral sides of the second passivation layer 802 are smoothly inclined, the profiles of the pixel electrodes 190 become smooth.

A TFT array panel for an LCD according to another embodiment of the present invention will be described in detail with reference to FIGS. 6A and 6B.

Figure 6A:
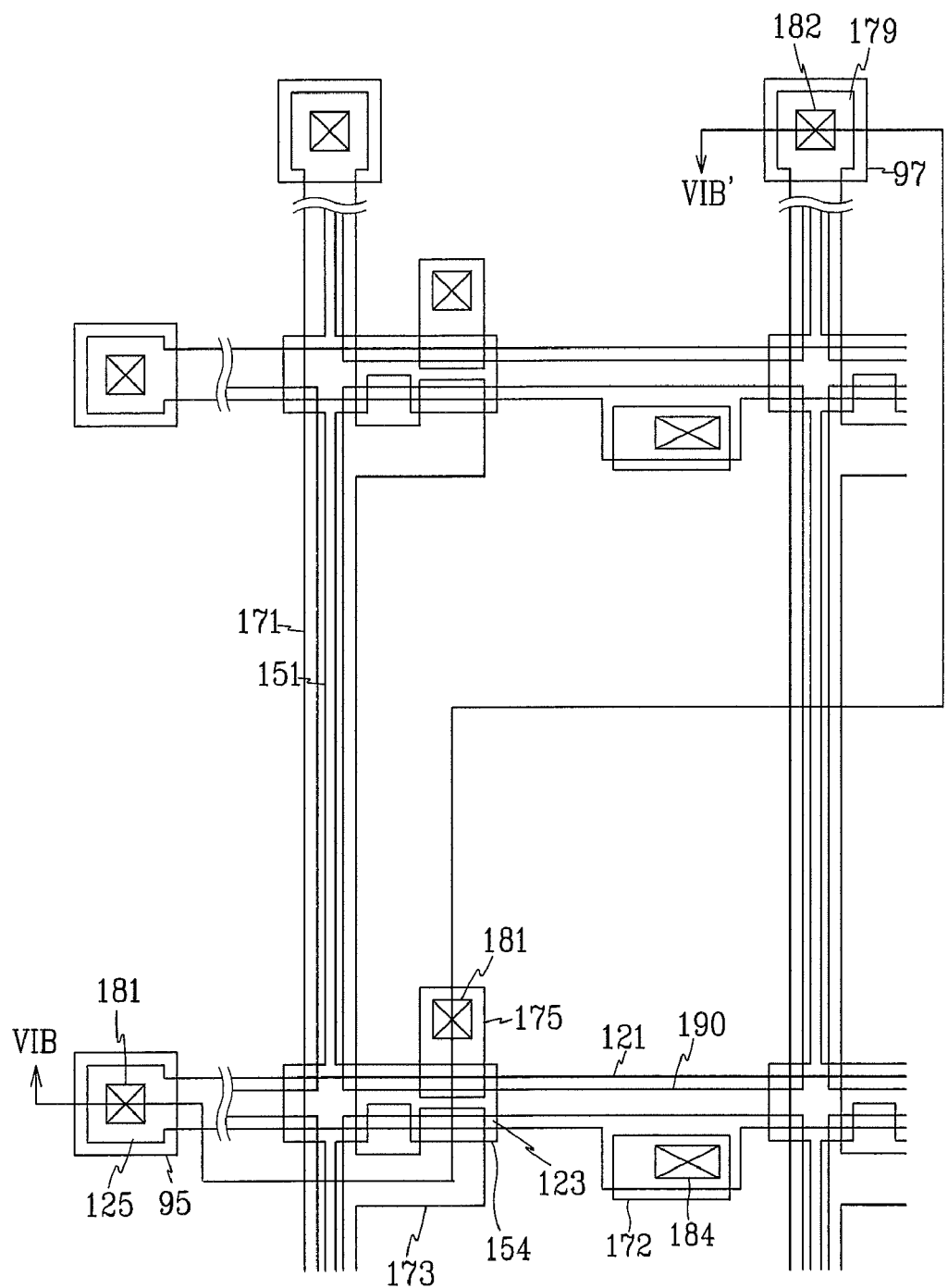
FIG. 6A is a layout view of an exemplary TFT array panel for an LCD according to another embodiment of the present invention.
Figure 6B:
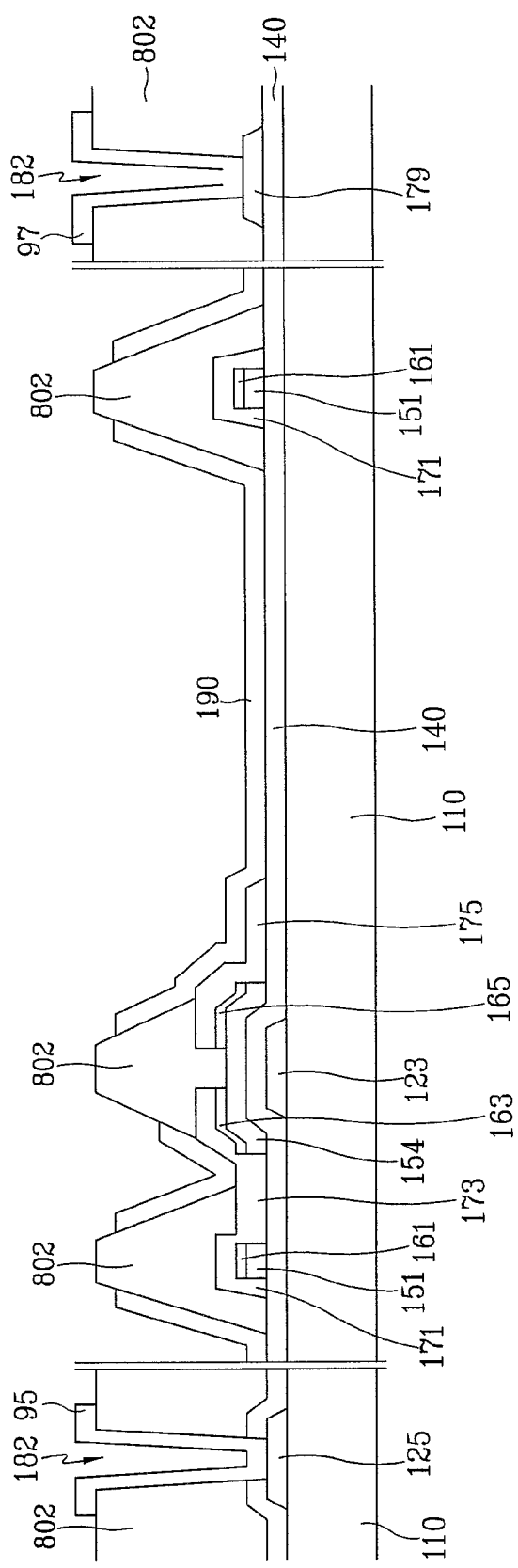
FIG. 6B is a sectional view of the TFT array panel shown in FIG. 6A taken along the line VIB-VIB'.

FIG. 6A is a layout view of an exemplary TFT array panel for an LCD according to another embodiment of the present invention, and FIG. 6B is a sectional view of the TFT array panel shown in FIG. 6A taken along the line VIB-VIB'.

As shown in FIGS. 6A and 6B, a layered structure of a TFT array panel of an LCD according to this embodiment is almost the same as that shown in FIGS. 1A and 1B. That is, a plurality of gate lines 121 including a plurality of gate electrodes 123 are formed on a substrate 110, and a gate insulating layer 140, a plurality of semiconductor stripes 151 including a plurality of projections 154, and a plurality of ohmic contact stripes 161 including a plurality of projections 163 and a plurality of ohmic contact islands 165 are sequentially formed thereon. A plurality of data lines 171 including a plurality of source electrodes 173, a plurality of drain electrodes 175, and a plurality of storage capacitor conductors 172 are formed on the ohmic contacts 161 and 165 and the gate insulating layer 140, and a passivation layer 802 (corresponding to the second passivation layer 802 shown in FIG. 1B) is formed thereon. A plurality of contact holes 181, 182, 183 and 184 are provided at the passivation layer 802 or the gate insulating layer 140, and a plurality of pixel electrodes 190 and a plurality of contact assistants 95 and 97 are formed on the passivation layer 802.

Different from the TFT array panel shown in FIGS. 1A and 1B, the TFT array panel according to this embodiment does not have a first passivation 801 shown in FIG. 1B. The omission of the first passivation layer increases the transmittance of the display device including the TFT array panel.

A TFT array panel for an LCD according to another embodiment of the present invention will be described in detail with reference to FIGS. 7A-7C.

Figure 7A:
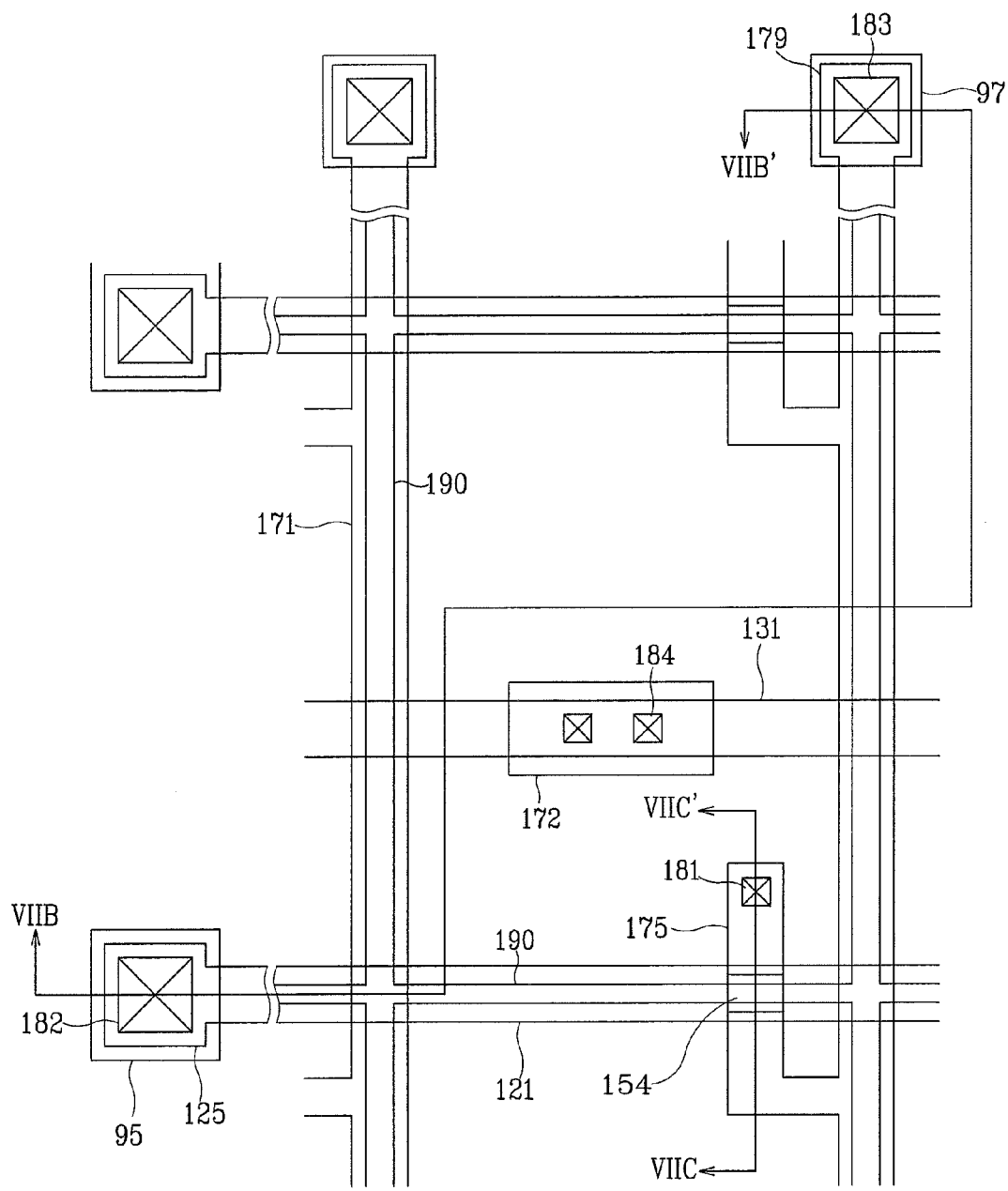
FIG. 7A is a layout view of an exemplary TFT array panel for an LCD according to another embodiment of the present invention.
Figure 7B:
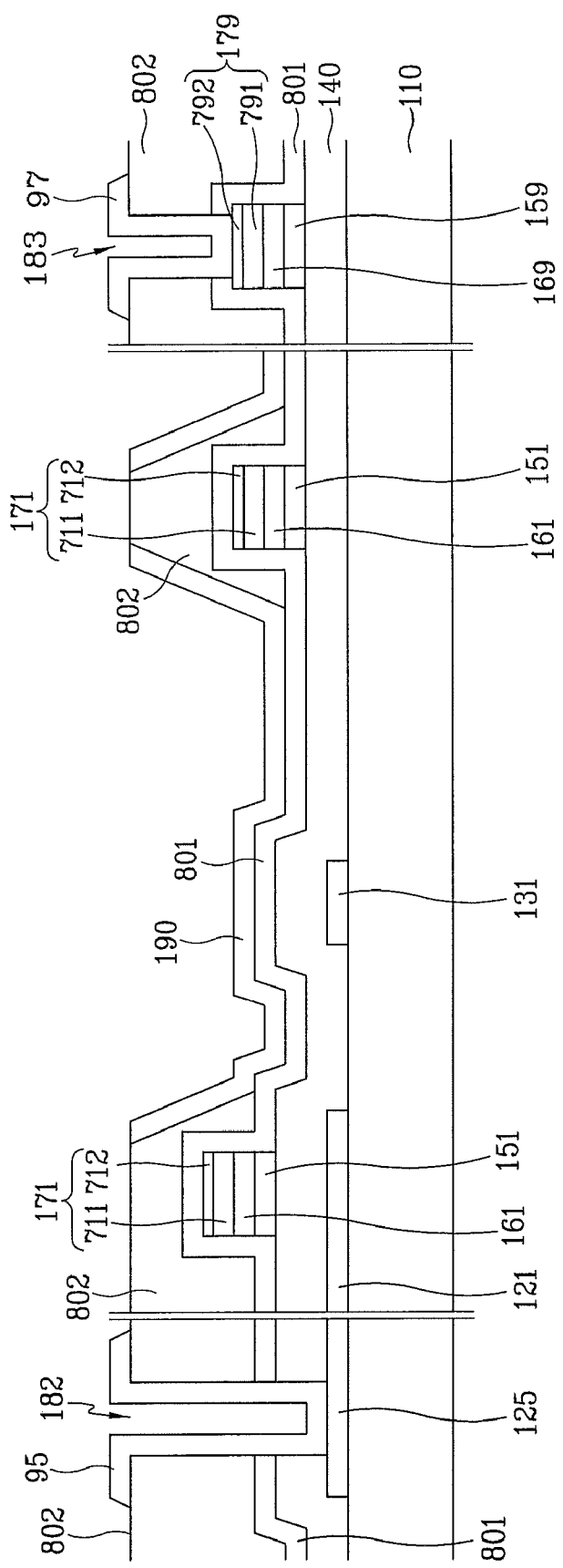

FIG. 7A is a layout view of an exemplary TFT array panel for an LCD according to another embodiment of the present invention, and FIGS. 7B and 7C are sectional views of the TFT array panel shown in FIG. 7A taken along the line VIIB-VIIB' and the line VIIC-VIIC', respectively.

As shown in FIGS. 7A-7C, a layered structure of a TFT array panel of an LCD according to this embodiment is almost the same as that shown in FIGS. 1A and 1B. That is, a plurality of gate lines 121 including a plurality of gate electrodes 123 are formed on a substrate 110, and a gate insulating layer 140, a plurality of semiconductor stripes 151 including a plurality of projections 154, and a plurality of ohmic contact stripes 161 including a plurality of projections 163 and a plurality of ohmic contact islands 165 are sequentially formed thereon. A plurality of data lines 171 including a plurality of source electrodes 173, a plurality of drain electrodes 175, and a plurality of storage capacitor conductors 172 are formed on the ohmic contacts 161 and 165, and first and second passivation layers 801 and 802 are formed thereon. A plurality of contact holes 181, 182, 183 and 184 are provided at the first and the second passivation layers 801 and 802 or the gate insulating layer 140, and a plurality of pixel electrodes 190 and a plurality of contact assistants 95 and 97 are formed on the second passivation layer 802.

Different from the TFT array panel shown in FIGS. 1A and 1B, the TFT array panel according to this embodiment provides a plurality of storage electrode lines 131, which are separated from the gate lines 121 and overlaps the storage capacitor conductors 172, on the same layer as the gate lines 121 without projections. The storage electrode lines 131 are supplied with a predetermined voltage such as the common voltage. The storage electrode lines 131 and the storage capacitor conductors 172 may be omitted if the storage capacitance generated by the overlapping of the gate lines 121 and the pixel electrodes 190 is sufficient.

The TFT array panel further includes a plurality of ohmic contact islands (not shown) and semiconductor islands (not shown) that are disposed under the storage capacitor conductors 172 and have substantially the same planar shape as the storage capacitor conductors 172.

In addition, the semiconductor stripes 151 have almost the same planar shapes as the data lines 171 and the drain electrodes 175 as well as the underlying ohmic contacts 161 and 165, except for the projections 154 where TFTs are provided. That is, the semiconductor stripes 151 include some exposed portions, which are not covered with the data lines 171 and the drain electrodes 175, such as portions located between the source electrodes 173 and the drain electrodes 175.

Furthermore, the data lines 171 and the drain electrodes 175 as well as the storage capacitor conductors 172 have a double layered structure including lower films 711 and 751 preferably made of Cr or Mo alloy and upper films 712 and 752 preferably made of low resistivity material such as Al or Ag containing metal. In FIG. 7b, the lower and the upper films of the source electrodes 173 are denoted as 731 and 732, respectively, and the lower and the upper films of end portions 179 of the data lines 171 are denoted as 791 and 792, respectively.

Many of the above-described features of the LCD shown in FIGS. 1A and 1B may be appropriate to the TFT array panel shown in FIGS. 7A-7C.

Now, a method of manufacturing the TFT array panel shown in FIGS. 7A-7C according to an embodiment of the present invention will be described in detail with reference to FIGS. 8A-12C as well as FIGS. 7A-7C.

Figure 8A:
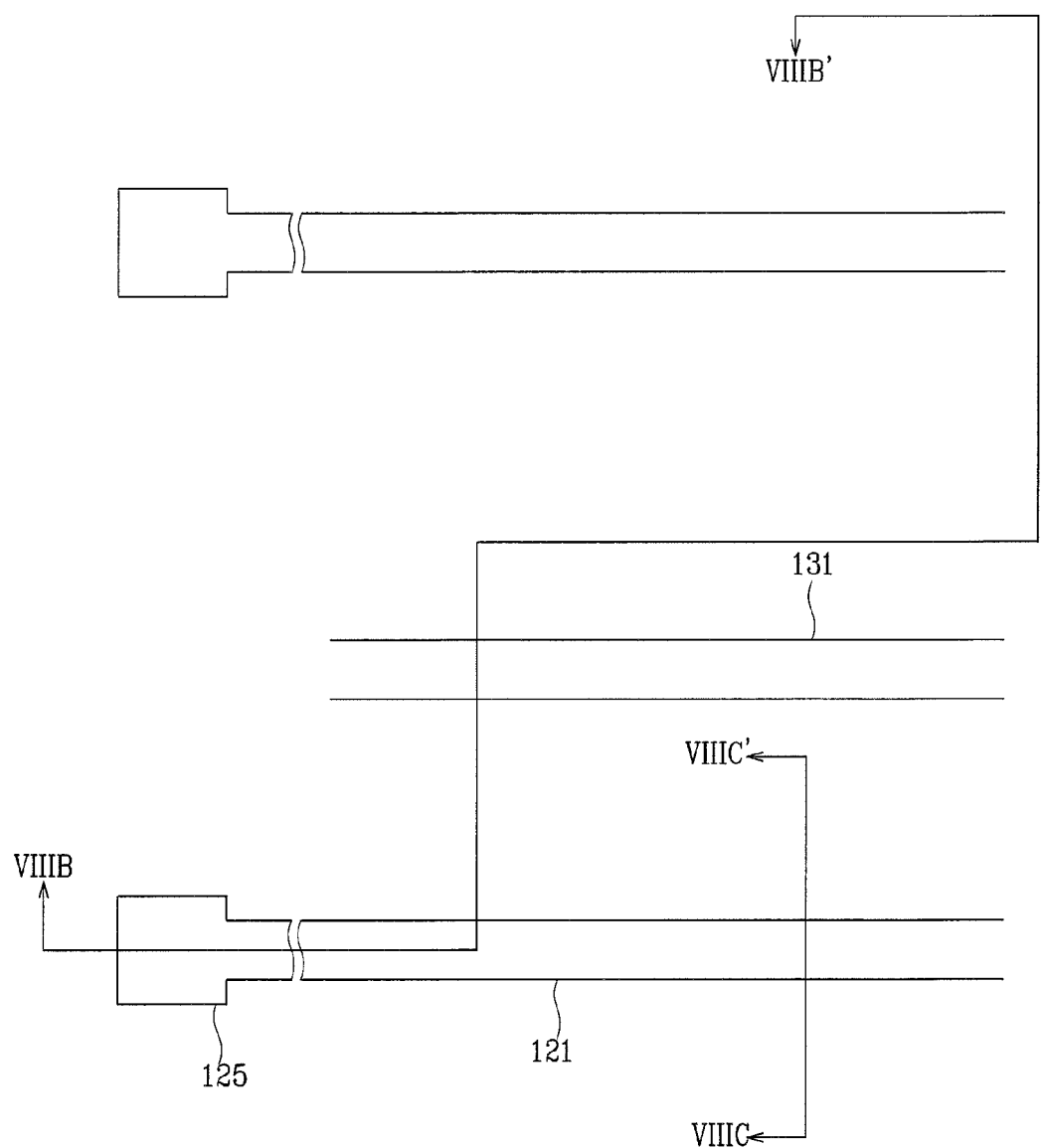
FIG. 8A is a layout view of a TFT array panel shown in FIGS. 7A-7C in the first step of a manufacturing method thereof according to an embodiment of the present invention.
Figure 8B:
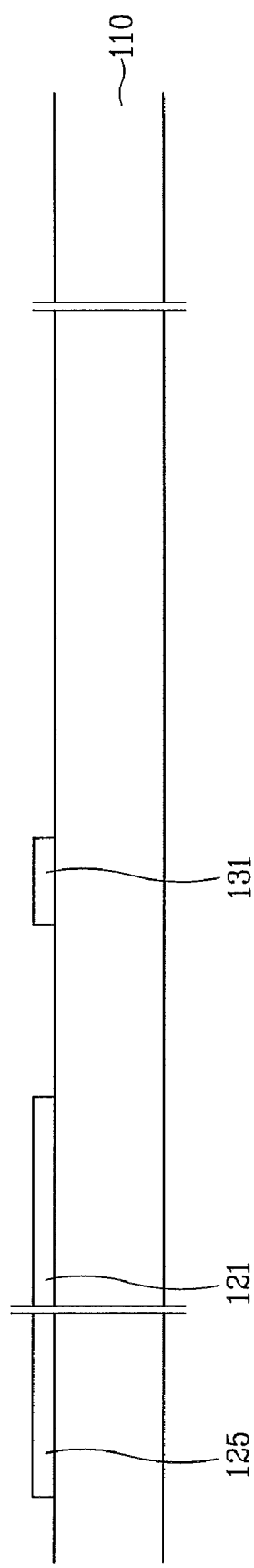
FIGS. 8B and 8C are sectional views of the TFT array panel shown in FIG. 8A taken along the lines VIIIB-VIIIB' and VIIIC-VIIIC', respectively.
Figure 8C:
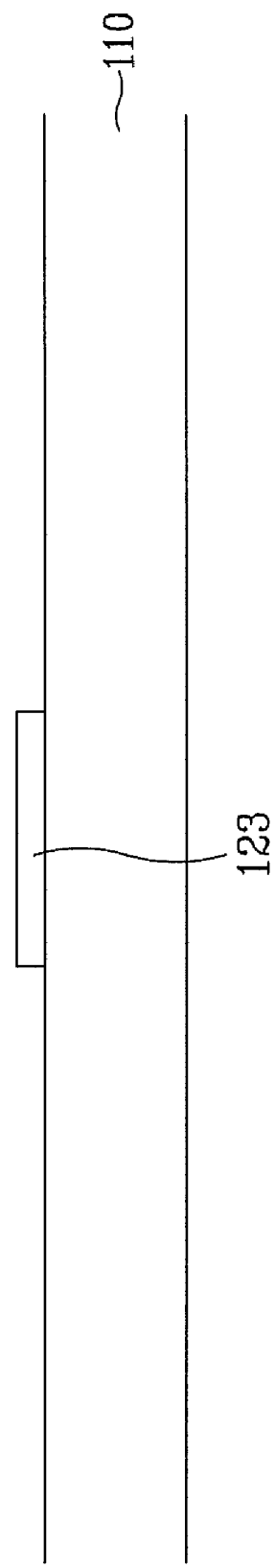
Figure 9A:
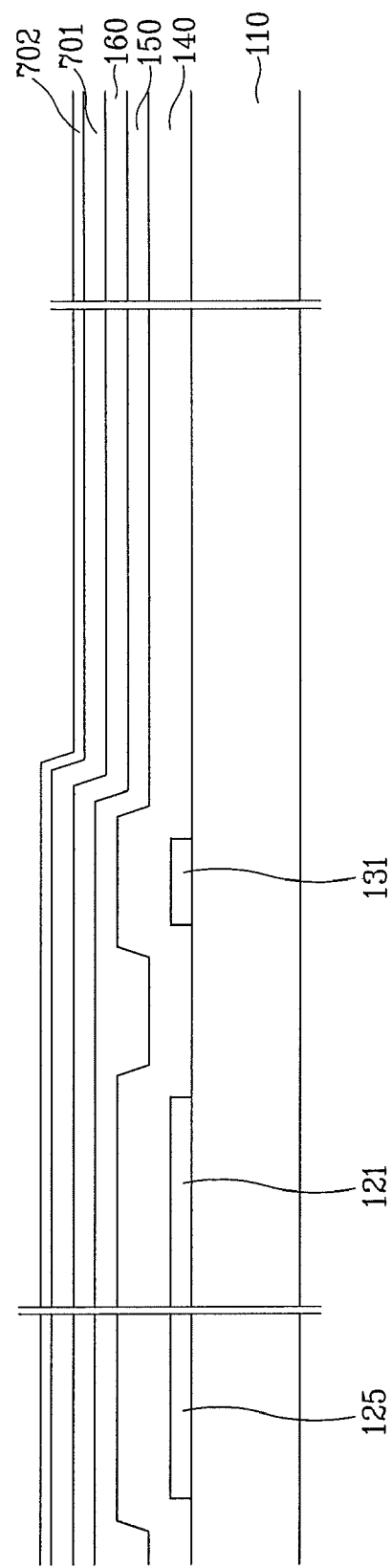
FIGS. 9A and 9B are sectional views of the TFT array panel shown in FIG. 8A taken along the lines VIIIB-VIIIB' and VIIIC-VIIIC', respectively, and illustrate the step following the step shown in FIGS. 8B and 8C.
Figure 9B:
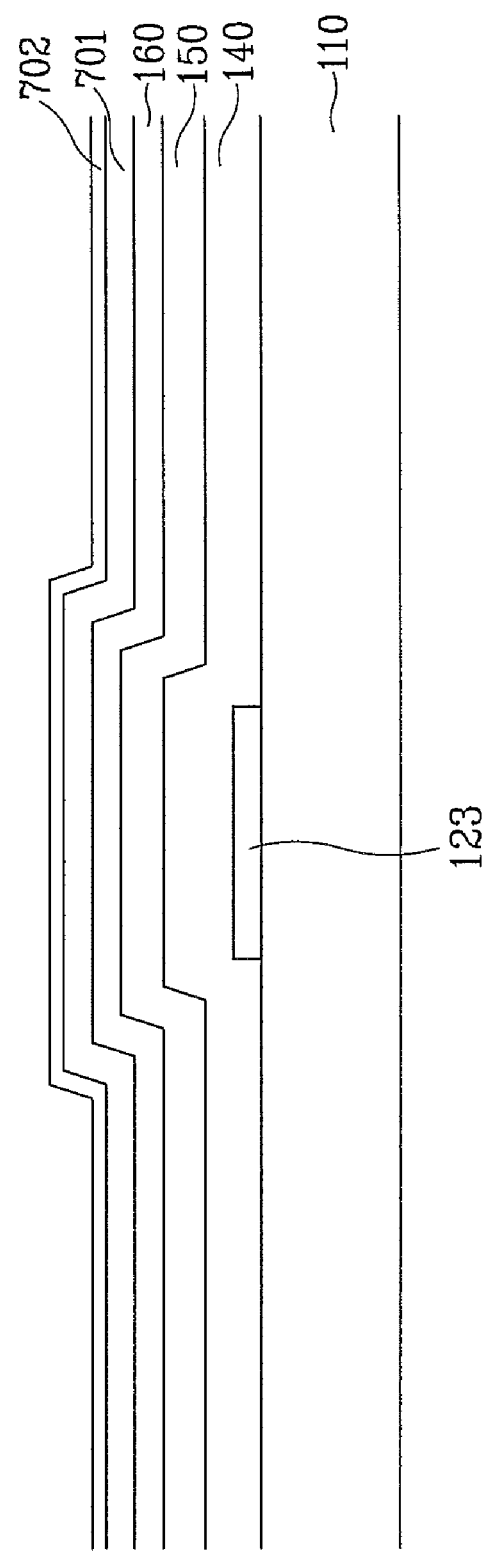
Figure 10B:
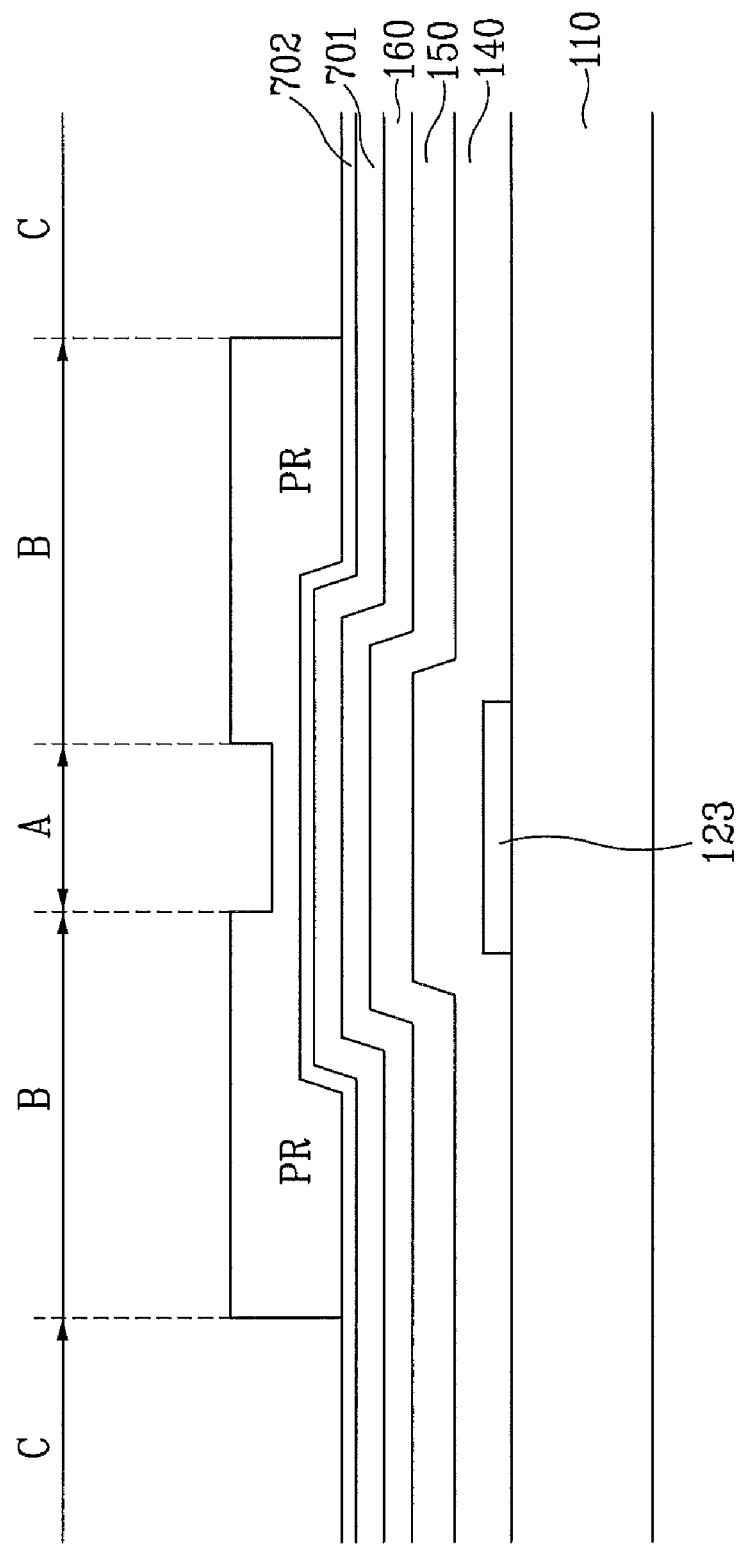
Figure 11A:
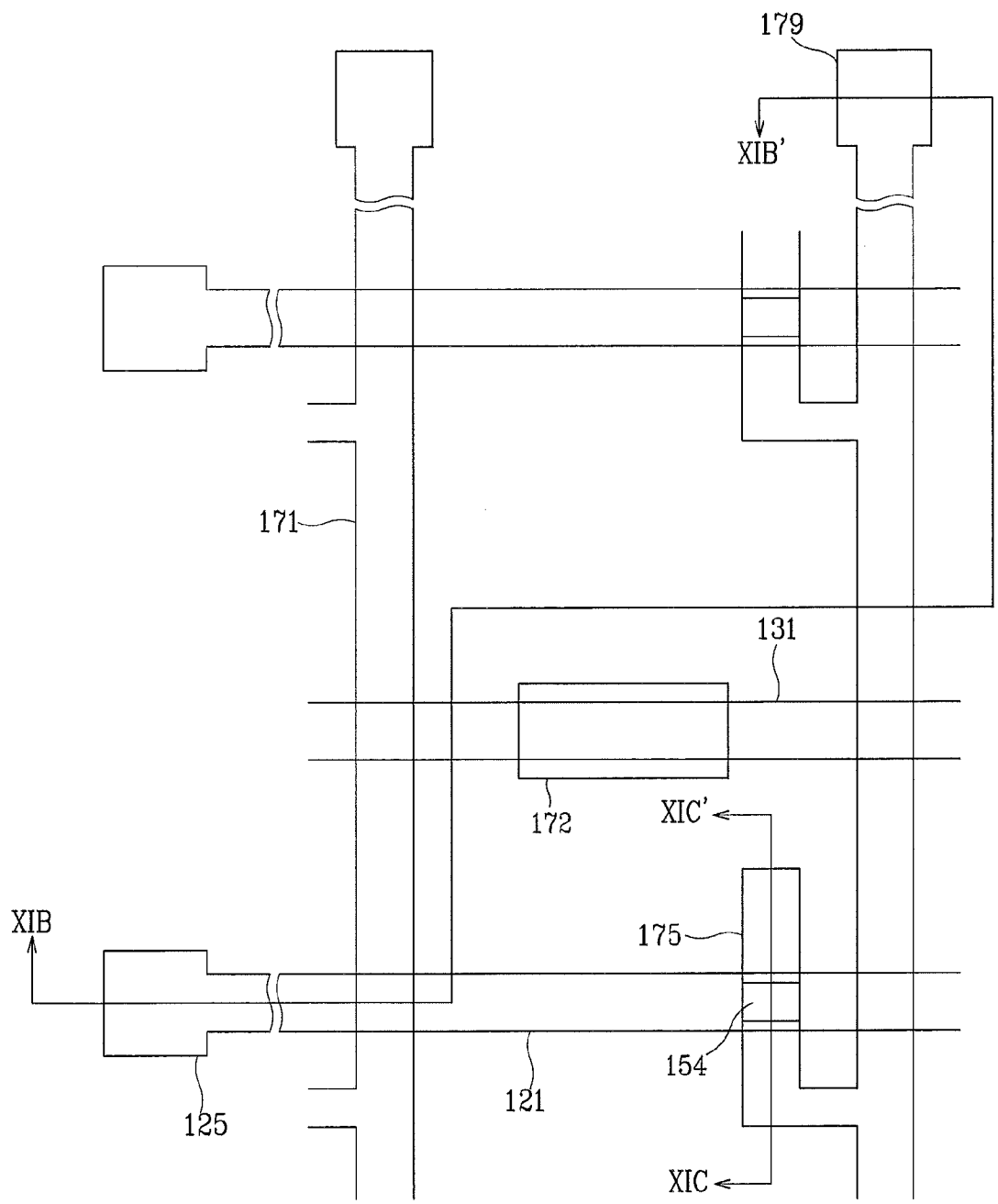
FIG. 11A is a layout view of the TFT array panel in the step following the step shown in FIGS. 10A and 10B.
Figure 12A:
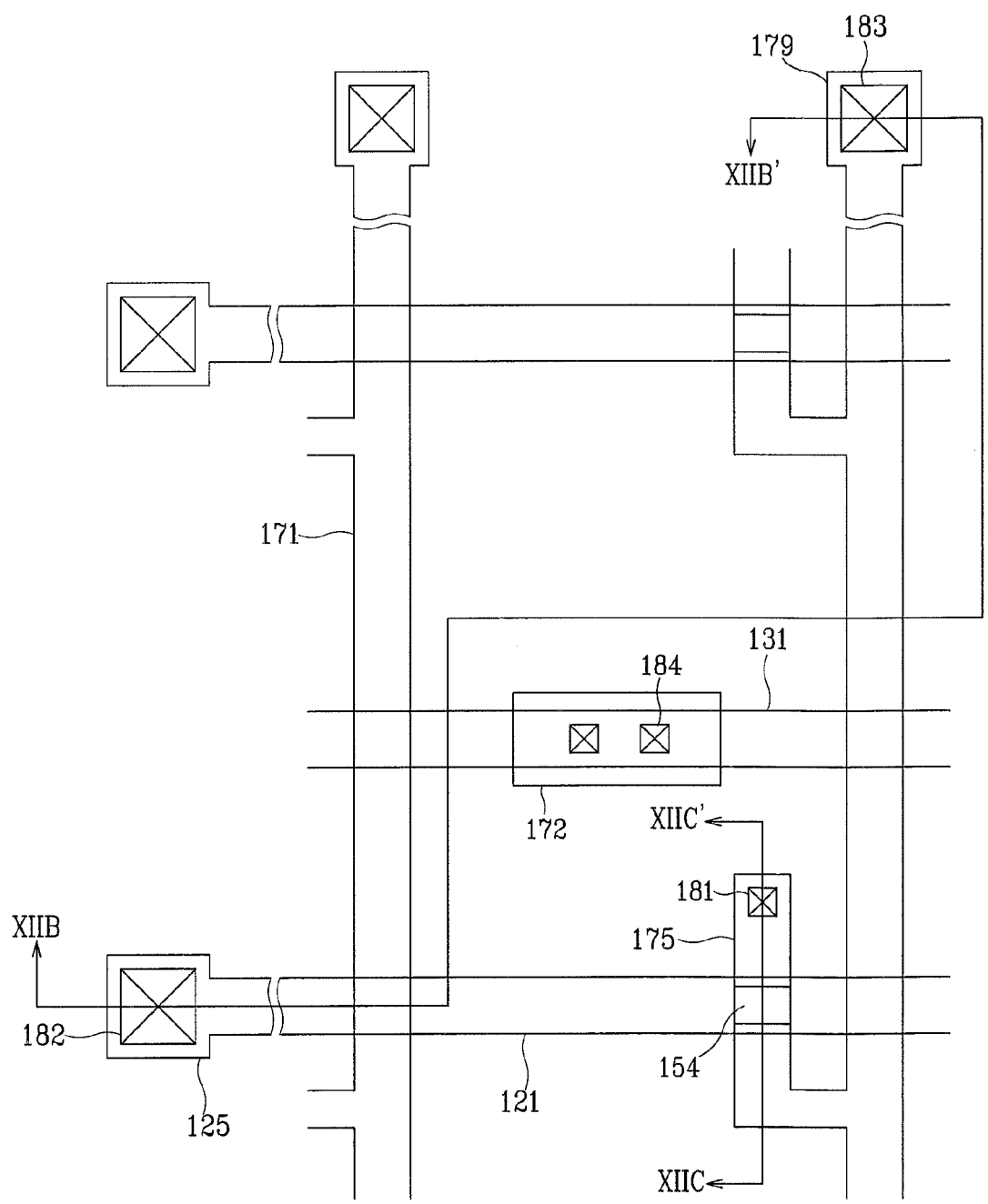
FIG. 12A is a layout view of a TFT array panel in the step following the step shown in FIGS. 11A-11C.
Figure 12B:
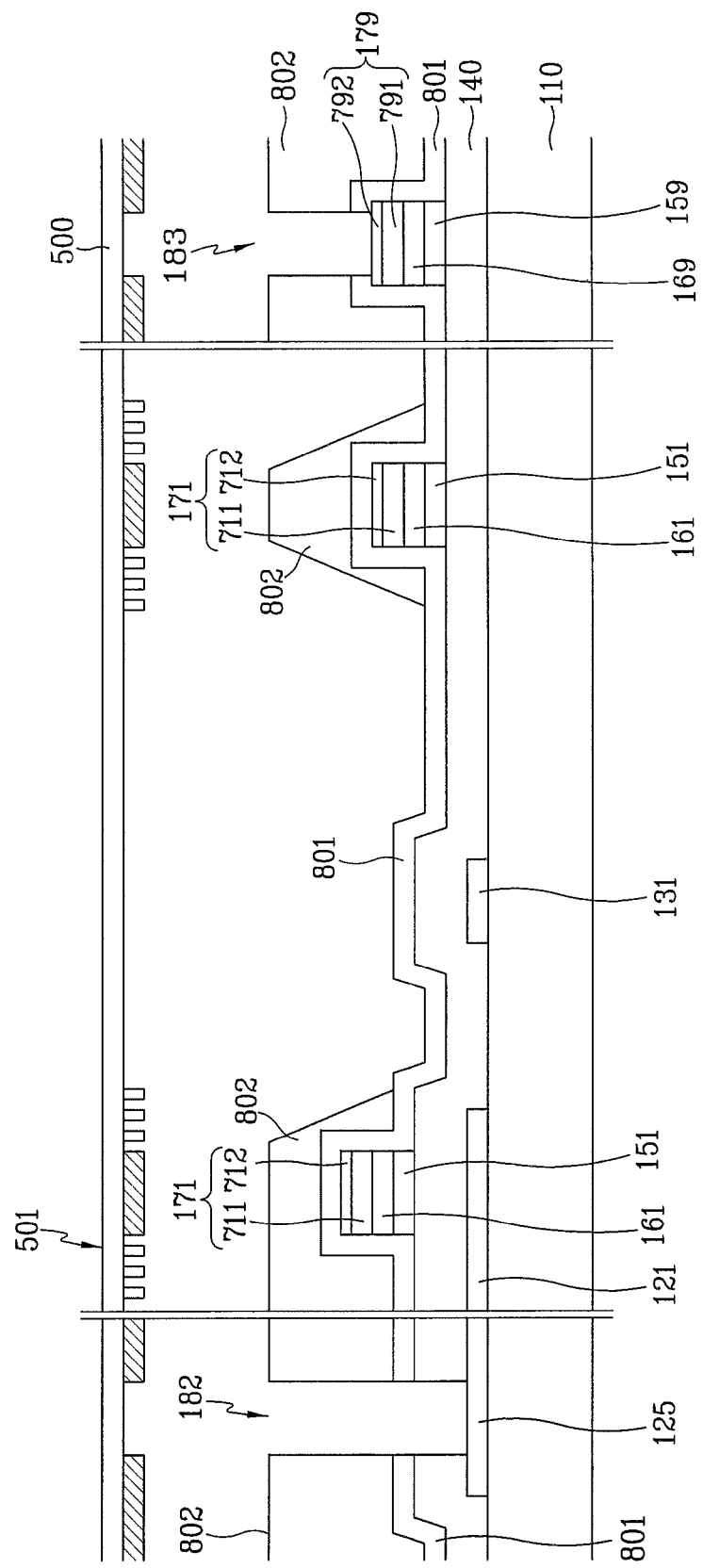

FIG. 8A is a layout view of a TFT array panel shown in FIGS. 7A-7C in the first step of a manufacturing method thereof according to an embodiment of the present invention; FIGS. 8B and 8C are sectional views of the TFT array panel shown in FIG. 8A taken along the lines VIIIB-VIIIB' and VIIIC-VIIIC', respectively; FIGS. 9A and 9B are sectional views of the TFT array panel shown in FIG. 8A taken along the lines VIIIB-VIIIB' and VIIIC-VIIIC', respectively, and illustrate the step following the step shown in FIGS. 8B and 8C; FIGS. 10A and 10B are sectional views of the TFT array panel shown in FIG. 8A taken along the lines VIIIB-VIIIB' and VIIIC-VIIIC', respectively, and illustrate the step following the step shown in FIGS. 9A and 9B; FIG. 11A is a layout view of the TFT array panel in the step following the step shown in FIGS. 10A and 10B; FIGS. 11B and 11C are sectional views of the TFT array panel shown in FIG. 11A taken along the lines XIB-XIB' and XIC-XIC', respectively; FIG. 12A is a layout view of a TFT array panel in the step following the step shown in FIGS. 11A-11C; and FIGS. 12B and 12C are sectional views of the TFT array panel shown in FIG. 12A taken along the lines XIIB-XIIB' and XIIC-XIIC', respectively.

Referring to FIGS. 8A-8C, a plurality of gate lines 121 including a plurality of gate electrodes 123 and a plurality of storage electrode lines 131 are formed on a substrate 110 by photo etching.

As shown in FIGS. 9A and 9B, a gate insulating layer 140, an intrinsic a-Si layer 150, and an extrinsic a-Si layer 160 are sequentially deposited by CVD. A conductive layer 170 including a lower film 701 of Cr or Mo alloy and an upper film 702 of Al or Ag alloy is deposited by sputtering.

Referring to FIGS. 10A and 10B, a photoresist film is coated on the conductive layer 170 and it is exposed to light through an exposure mask (not shown), and developed such that the developed photoresist PR has a position dependent thickness. The photoresist PR shown in FIGS. 10A and 10B includes a plurality of first to third portions with decreased thickness. The first portions are located on wire areas B, the second portions are located on channel areas A, and the third portions located on remaining areas C have substantially zero thickness to expose underlying portions of the conductive layer 170.

The different thickness of the photoresist PR enables to selectively etch the underlying layers when using suitable process conditions. Therefore, a plurality of data lines 171 including a plurality of source electrodes 173, and a plurality of drain electrodes 175, as well as a plurality of ohmic contact stripes 161 including a plurality of projections 163, a plurality of ohmic contact islands 165 and a plurality of semiconductor stripes 151 including a plurality of projections 154 are obtained by a series of etching steps.

For descriptive purpose, portions of the conductive layer 170, the extrinsic a-Si layer 160, and the intrinsic a-Si layer 150 on the wire areas B are called first portions, portions of the conductive layer 170, the extrinsic a-Si layer 160, and the intrinsic a-Si layer 150 on the channel areas A are called second portions, and portions of the conductive layer 170, the extrinsic a-Si layer 160, and the intrinsic a-Si layer 150 on the remaining areas C are called third portions.

An exemplary sequence of forming such a structure is as follows:

(1) Removal of third portions of the conductive layer 170, the extrinsic a-Si layer 160 and the intrinsic a-Si layer 150 on the wire areas B;

(2) Removal of the second portions 314 of the photoresist PR;

(3) Removal of the second portions of the conductive layer 170 and the extrinsic a-Si layer 160 on the channel areas A; and (4) Removal of the first portions of the photoresist PR.

Another exemplary sequence is as follows:

(1) Removal of the third portions of the conductive layer 170;

(2) Removal of the second portions of the photoresist PR;

(3) Removal of the third portions of the extrinsic a-Si layer 160 and the intrinsic a-Si layer 150;

(4) Removal of the second portions of the conductive layer 170;

(5) Removal of the first portions of the photoresist PR; and (6) Removal of the second portions of the extrinsic a-Si layer 160.

The first example is described in detail.

In the step (1), the exposed third portions of the lower and the upper films 701 and 702 of the conductive layer 170 on the remaining areas C are simultaneously removed by wet etching with an etchant containing acetic acid, phosphoric acid, and nitric acid.

In this step, the formation of the storage capacitor conductors 172 is completed.

Next, the third portions of the extrinsic a-Si layer 160 and of the intrinsic a-Si layer 150 on the areas C are removed preferably by dry etching and the second portions of the photoresist PR are removed to expose the second portions of the conductors 178. The removal of the second portions of the photoresist PR are performed either simultaneously with or independent from the removal of the third portions of the extrinsic a-Si layer 160 and of the intrinsic a-Si layer 150. Residue of the second portions of the photoresist PR remained on the channel areas A is removed by ashing.

The semiconductor stripes 151 are completed in this step.

Next, the second portions of the conductive layer 170 and the extrinsic a-Si layer 160 on the channel areas A as well as the first portion of the photoresist PR are removed.

Top portions of the projections 154 of the intrinsic semiconductor stripes 151 on the channel areas A may be removed to cause thickness reduction, and the first portions of the photoresist PR are etched to a predetermined thickness.

In this way, the formation of the data lines 171, the drain electrodes 175, the ohmic contact stripes and islands 161 and 165 is completed.

As shown in FIGS. 12A-12C, a first passivation layer 801 preferably made of silicon nitride is deposited and patterned along with the gate insulating layer 140 to form a plurality of contact holes 181 and 184 exposing the drain electrodes 175 and the storage capacitor conductors 172, respectively.

Subsequently, a second passivation layer 802 preferably made of photosensitive organic insulator is coated. The second passivation layer 802 may be made of an acrylic organic insulator having a good flatness or a low dielectric CVDed (chemical-vapor-deposited) insulator such as SiOC or SiOF having a dielectric constant lower than about 4.0.

A photo-mask 500 having a plurality of transmissive areas, a plurality of light blocking areas, and a plurality slit areas 501 is aligned with the substrate such that the slit areas 501 correspond to the light blocking areas corresponding to the data lines 171 and the gate lines 121 and the transmissive areas correspond to the end portions 125 and 179 of the gate lines 121 and the data lines 171 and areas enclosed by the data lines 171 and the gate lines 121. The second passivation layer 802 is then exposed to light and developed, and then portions of the second passivation layer 802 corresponding to the slit areas 501 form inclined surfaces having an inclination angle smaller than about 40 degrees, preferably about 13-30 degrees.

The first passivation layer 801 and the gate insulating layer 140 are patterned to form a plurality of contact holes 182 and 183 exposing the end portions 125 and 179 of the gate lines 121 and the data lines 171, respectively.

Finally, as shown in FIGS. 7A to 7C, an ITO or IZO layer is sputtered and photo-etched to form a plurality of pixel electrodes 190 and a plurality of contact assistants 95 and 97.

This embodiment simplifies the manufacturing process by forming the data lines 171 and the drain electrodes 175 as well as the ohmic contacts 161 and 165 and the semiconductor stripes 151 and using a single photolithography step.

A TFT array panel for an LCD according to another embodiment of the present invention will be described in detail with reference to FIGS. 13A-13C.

Figure 13A:
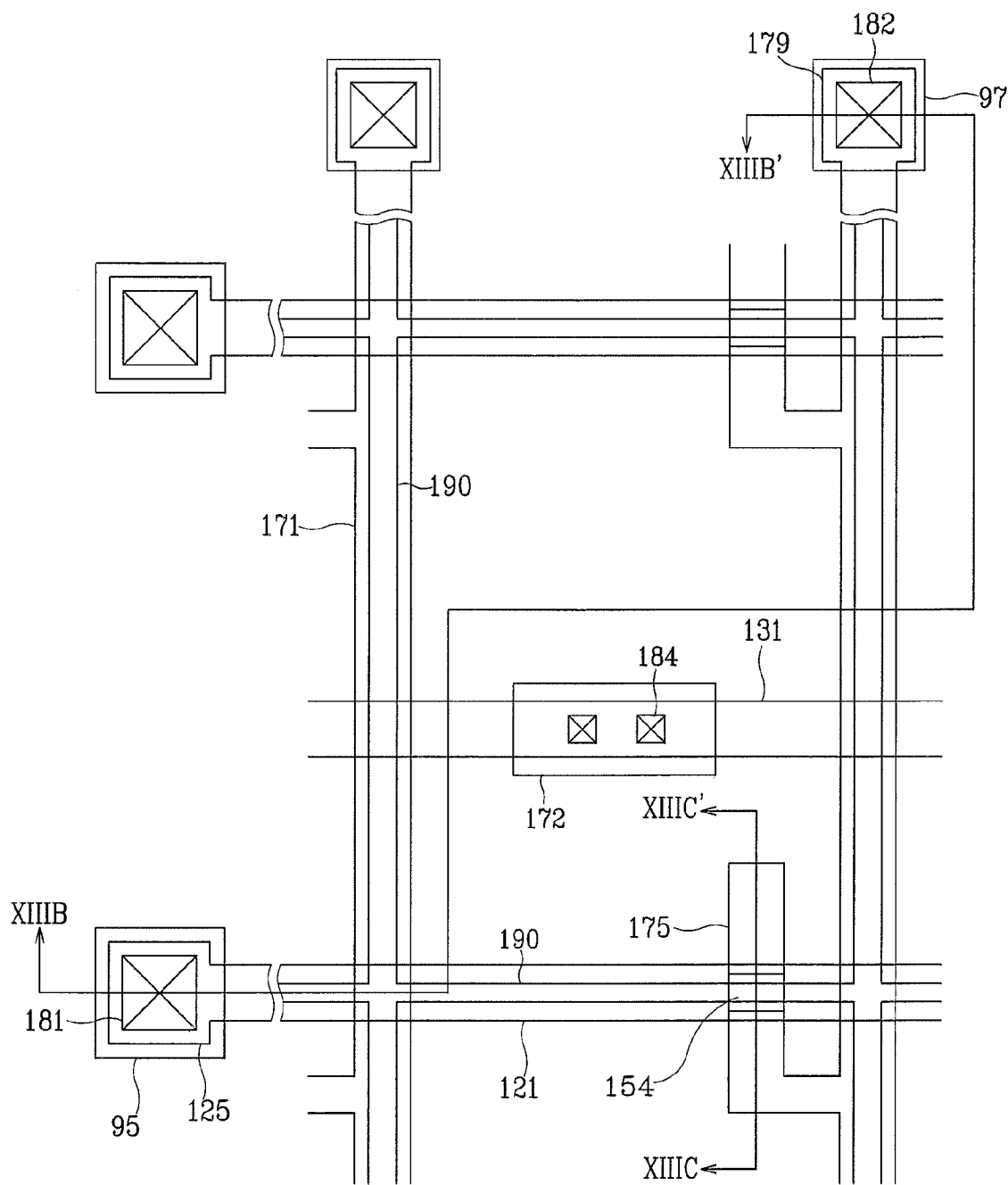
FIG. 13A is a layout view of an exemplary TFT array panel for an LCD according to another embodiment of the present invention.
Figure 13B:
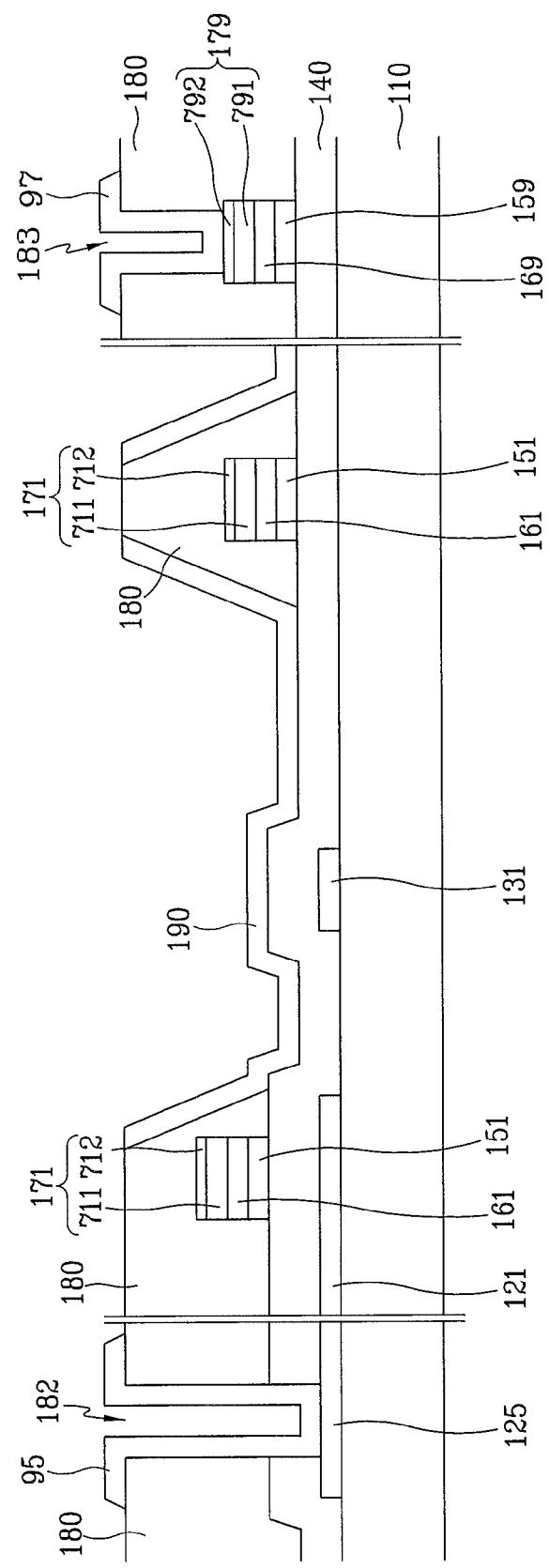
FIGS. 13B and 13C are sectional views of the TFT array panel shown in FIG. 13A taken along the line XIIIB-XIIIB' and the line XIIIC-XIIIC'.
Figure 13C:
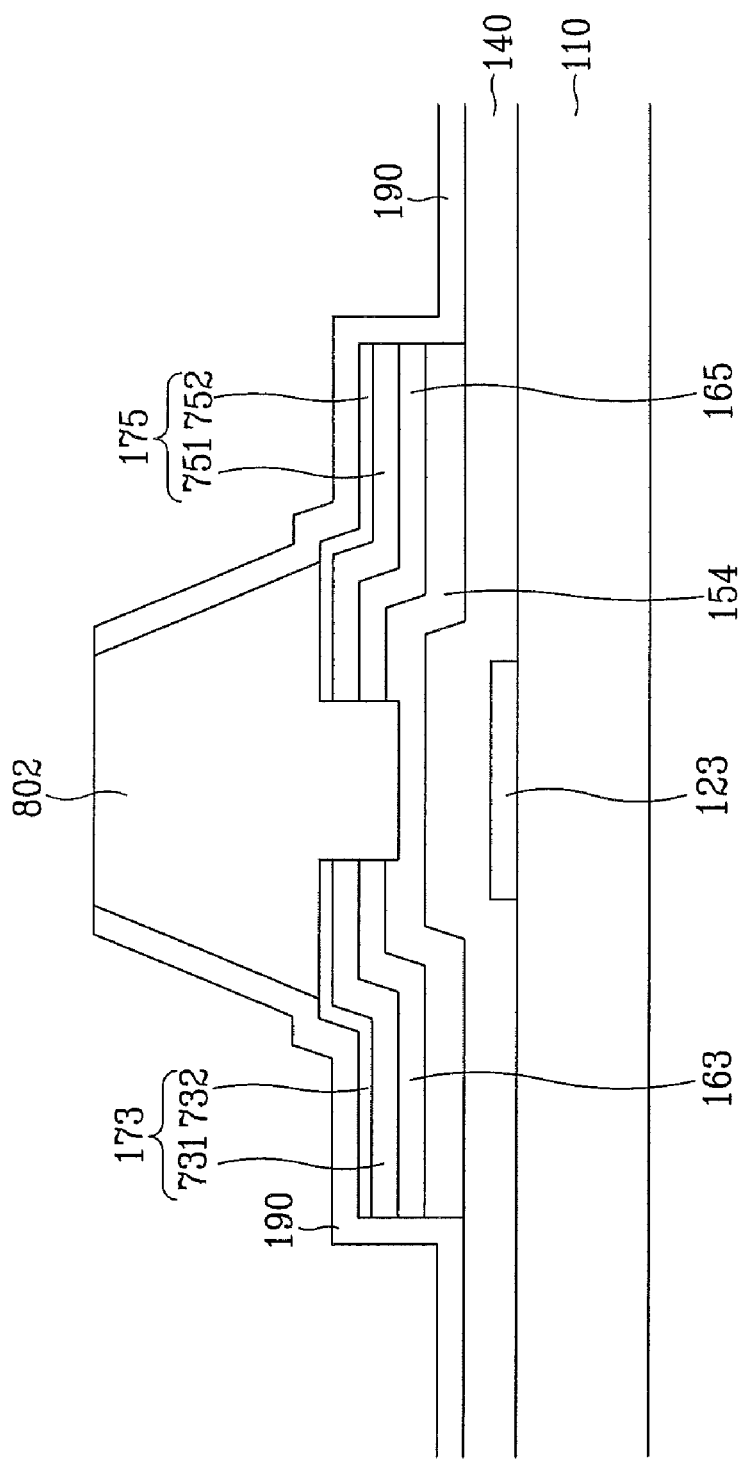

FIG. 13A is a layout view of an exemplary TFT array panel for an LCD according to another embodiment of the present invention, and FIGS. 13B and 13C are sectional views of the TFT array panel shown in FIG. 13A taken along the line XIIIB-XIIIB' and the line XIIIC-XIIIC'.

As shown in FIGS. 13A-13C, a layered structure of a TFT array panel of an LCD according to this embodiment is almost the same as that shown in FIGS. 7A-7C. That is, a plurality of gate lines 121 including a plurality of gate electrodes 123 are formed on a substrate 110, and a gate insulating layer 140, a plurality of semiconductor stripes 151 including a plurality of projections 154, and a plurality of ohmic contact stripes 161 including a plurality of projections 163 and a plurality of ohmic contact islands 165 are sequentially formed thereon. A plurality of data lines 171 including a plurality of source electrodes 173, a plurality of drain electrodes 175, and a plurality of storage capacitor conductors 172 are formed on the ohmic contacts 161 and 165, and a passivation layer 802 (corresponding to the second passivation layer 802 shown in FIGS. 7B and 7C) is formed thereon. A plurality of contact holes 181, 182, 183 and 184 are provided at the passivation layer 802 or the gate insulating layer 140, and a plurality of pixel electrodes 190 and a plurality of contact assistants 95 and 97 are formed on the passivation layer 802.

Different from the TFT array panel shown in FIGS. 7A-7C, the TFT array panel according to this embodiment does not have a first passivation 801 shown in FIGS. 7B and 7C. The omission of the first passivation layer increases the transmittance of the display device including the TFT array panel.

FIGS. 14A-14C and 15 are simulated diagram illustrating light transmittance, equipotential lines, and arrangements of liquid crystal molecules in LCDs having inclined passivation surfaces.

As shown in FIGS. 14A-14C and 15, the LCD includes lower and upper panels facing each other and a liquid crystal layer. The upper panel includes a black matrix 220, color filters 230, and a common electrode formed in sequence. The lower panel includes a gate insulating layer 140, a semiconductor stripe 151, a data line 171, a first passivation layer 801, a second passivation layer 802, and pixel electrodes 190 sequentially formed on a substrate. The second passivation layer 802 has a flat top surface and inclined lateral surfaces.

Figure 14A:
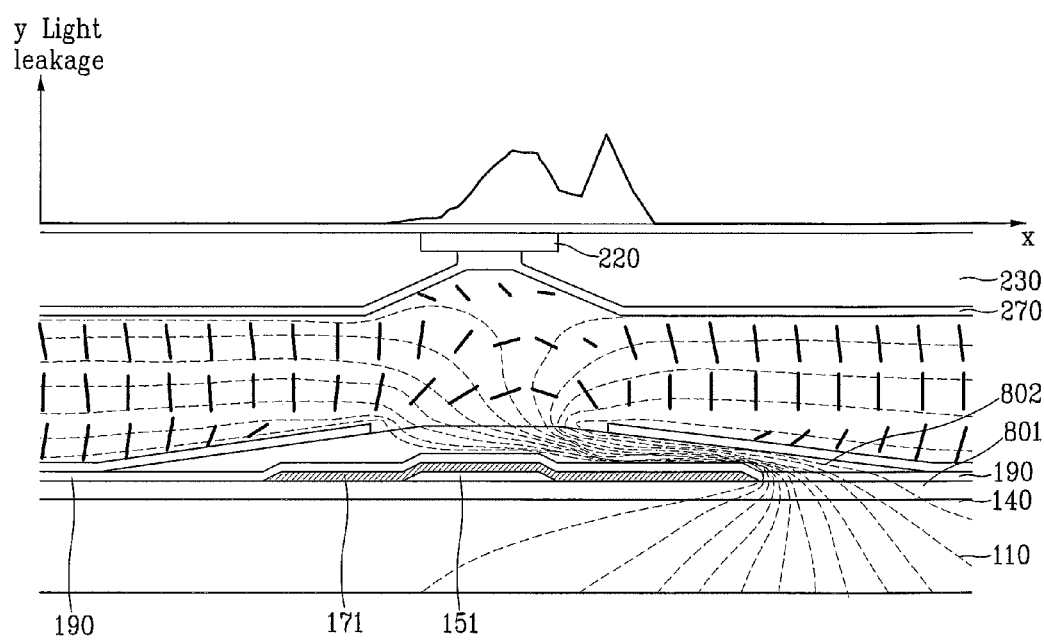
FIGS. 14A-14C and 15 are simulated diagram illustrating light transmittance, equipotential lines, and arrangements of liquid crystal molecules in LCDs having inclined passivation surfaces.
Figure 14B:
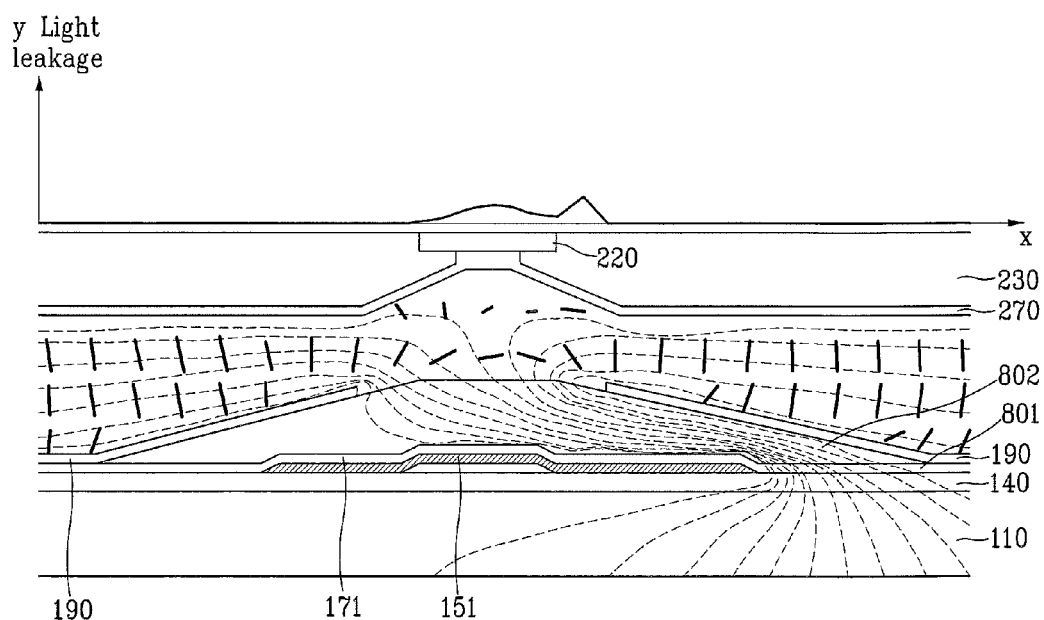
Figure 14C:
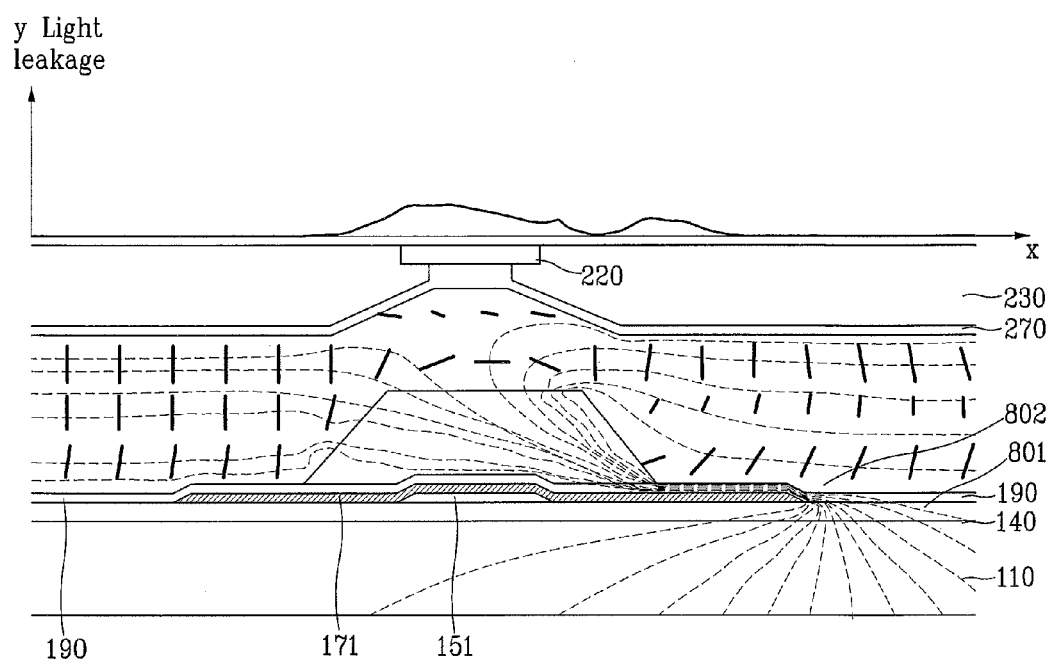

Referring to FIGS. 14A-14C, the pixel electrodes 190 are disposed on the lateral surfaces. The inclination angles of the inclined lateral surfaces of the second passivation layer 802 shown in FIGS. 14A, 14B and 14C are 6.5 degrees, 13.5 degrees, and 51.5 degrees, respectively.

As shown in the figures, the light leakage shown in FIGS. 14A and 14C is greater than that shown in FIG. 14B. The slow slope smaller than about 13 degrees expanded the light leakage into pixel areas and increased the transmittance in a black state. On the contrary, the steep slope larger than about 40 degrees increased the parasitic capacitance between the data lines 171 and the pixel electrodes 190, thereby increasing the light leakage.

Accordingly, the simulation shows that the slope of the second passivation layer 802 ranging between about 13 degrees and about 40 degrees reduces the light leakage.

Figure 15:
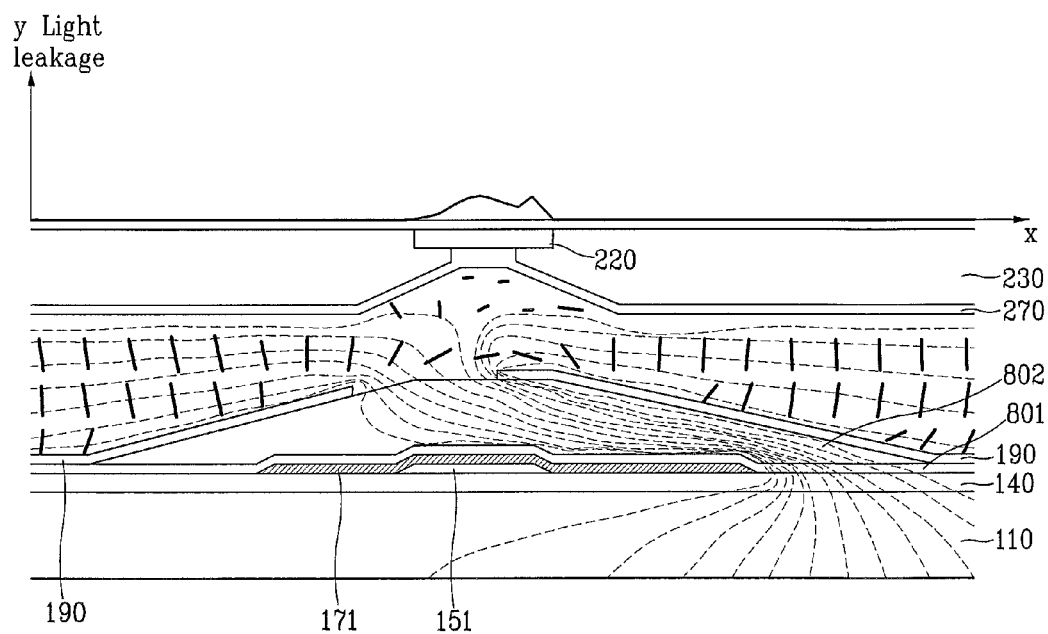

Referring to FIG. 15, one of the pixel electrodes 190 is disposed only on a lateral surface while the other of the pixel electrodes 190 is disposed both on a lateral surface and the top surface.

The light leakage shown in FIG. 15 was hardly changed compared with that shown in FIG. 14B. However, the parasitic capacitance between the pixel electrode 190 and the data line 171 was much increased.

Accordingly, the simulation shows that the pixel electrodes 190 are disposed preferably on the inclined lateral surface of the second passivation layer 802 but not on the top surface thereof.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A thin film array panel comprising:
   a gate line formed on a substrate;
   a first insulating layer on the gate line;
   a data line formed on the first insulating layer;
   a second insulating layer formed on the data line and having an opening;
   a pixel electrode formed on the first insulating layer and overlapping the data line and the second insulating layer; and
   a third insulating layer disposed between the pixel electrode and the first insulating layer,
   wherein a center portion of the pixel electrode is formed on the third insulating layer and an edge portion of the pixel electrode overlaps a lateral surface of the second insulating layer,
   wherein the center portion of the pixel electrode is in direct contact with the third insulating layer,
   wherein a bottom surface of the second insulating layer is in direct contact only with the third insulating layer, and
   wherein the second insulating layer has a top surface and the pixel electrode does not overlap the top surface of the second insulating layer.

2. The thin film array panel of claim 1, wherein the second insulating layer has an inclined lateral surface.

3. The thin film array panel of claim 2, wherein the pixel electrode overlaps the lateral surface of the second insulating layer.

4. The thin film array panel of claim 3, wherein the lateral surface of the second insulating layer has an inclination angle of about 13-40 degrees.

5. The thin film array panel of claim 1, wherein the second insulating layer has a dielectric constant smaller than about 4.0.

6. The thin film array panel of claim 5, wherein the second insulating layer comprises an acrylic organic material.

7. The thin film array panel of claim 1, wherein the third insulating layer comprises inorganic material.

8. The thin film array panel of claim 7, wherein the third insulating layer comprises silicon nitride.

9. The thin film array panel of claim 1, wherein the second insulating layer covers the gate line.

10. The thin film array panel of claim 1, further comprising a thin film transistor connected to the gate line, the data line, and the pixel electrode.

11. The thin film array panel of claim 1, further comprising a light blocking film disposed between the data line and the pixel electrode.

12. The thin film array panel of claim 1, wherein a light blocking film is formed under the first insulating layer.

* * * * *